(12) United States Patent
Cheng et al.

(10) Patent No.: US 9,058,987 B2
(45) Date of Patent: Jun. 16, 2015

(54) RARE-EARTH OXIDE ISOLATED SEMICONDUCTOR FIN

(71) Applicant: International Business Machines Corporation, Armonk, NY (US)

(72) Inventors: Kangguo Cheng, Schenectady, NY (US); Joseph Ervin, Wappingers Falls, NY (US); Chengwen Pei, Danbury, CT (US); Ravi M. Todi, San Diego, CA (US); Geng Wang, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/336,407

(22) Filed: Jul. 21, 2014

(65) Prior Publication Data

US 2015/0037939 A1   Feb. 5, 2015

Related U.S. Application Data

(62) Division of application No. 13/328,358, filed on Dec. 16, 2011, now Pat. No. 8,853,781.

(51) Int. Cl.
| | |
|---|---|
| *H01L 21/00* | (2006.01) |
| *H01L 21/84* | (2006.01) |
| *H01L 21/02* | (2006.01) |
| *H01L 29/66* | (2006.01) |
| *H01L 29/78* | (2006.01) |

(52) U.S. Cl.
CPC .... *H01L 21/02488* (2013.01); *H01L 29/66795* (2013.01); *H01L 29/785* (2013.01); *H01L 21/02513* (2013.01); *H01L 21/02587* (2013.01); *H01L 21/02598* (2013.01); *H01L 21/02642* (2013.01)

(58) Field of Classification Search
USPC .................................................. 438/164, 151
See application file for complete search history.

(56) References Cited

U.S. PATENT DOCUMENTS

| | | | |
|---|---|---|---|
| 6,657,252 B2 | 12/2003 | Fried et al. | |
| 7,101,763 B1 | 9/2006 | Anderson et al. | |
| 7,135,699 B1 | 11/2006 | Atanackovic | |

(Continued)

OTHER PUBLICATIONS

Mendez, M. et al., "Comparing Soi and Bulk FinFETs: Performance, Manufacturing Variability, and Cost" Solid State Technology (Nov. 2009) pp. 10, 12-15, vol. 52, No. 11.
Translucent Inc., "Crystalline Rare Earth Oxide" rev. May 2011, 4 pages, downloaded Sep. 12, 2011.

(Continued)

*Primary Examiner* — Thien F Tran
(74) *Attorney, Agent, or Firm* — Scully, Scott, Murphy & Presser, P.C.; Joseph P. Abate, Esq.

(57) ABSTRACT

A dielectric template layer is deposited on a substrate. Line trenches are formed within the dielectric template layer by an anisotropic etch that employs a patterned mask layer. The patterned mask layer can be a patterned photoresist layer, or a patterned hard mask layer that is formed by other image transfer methods. A lower portion of each line trench is filled with an epitaxial rare-earth oxide material by a selective rare-earth oxide epitaxy process. An upper portion of each line trench is filled with an epitaxial semiconductor material by a selective semiconductor epitaxy process. The dielectric template layer is recessed to form a dielectric material layer that provides lateral electrical isolation among fin structures, each of which includes a stack of a rare-earth oxide fin portion and a semiconductor fin portion.

17 Claims, 23 Drawing Sheets

(56) References Cited

U.S. PATENT DOCUMENTS

| | | |
|---|---|---|
| 7,183,152 B1 | 2/2007 | Dakshina-Murthy et al. |
| 7,432,569 B1 | 10/2008 | Atanackovic |
| 7,452,758 B2 | 11/2008 | Dyer et al. |
| 7,671,426 B2 | 3/2010 | Mise et al. |
| 7,902,546 B2 | 3/2011 | Atanackovic |
| 2009/0291535 A1* | 11/2009 | Atanackovic et al. ........ 438/151 |
| 2010/0301420 A1 | 12/2010 | Merckling et al. |
| 2011/0108930 A1 | 5/2011 | Cheng et al. |
| 2011/0291188 A1 | 12/2011 | Cheng et al. |

OTHER PUBLICATIONS

Xu, X., "High Performance Bio FinFETs Based on Bulk-Silicon Substrate" IEEE Transactions on Electron Devices (Nov. 2008) pp. 3246-3250, vol. 55, Issue 11.

Anwar, A. et al., "A Comparative Numerical Simulation of a Nanoscaled Body on Insulator FinFet" 27th International Conference on Microelectronics Proceedings (MIEL) (May 16-19, 2010) pp. 413-416.

International Search Report dated Jan. 28, 2013, filed in PCT/US2012/064600.

* cited by examiner

RARE-EARTH OXIDE ISOLATED SEMICONDUCTOR FIN

CROSS REFERENCE TO RELATED APPLICATION

This application is a divisional of U.S. patent application Ser. No. 13/328,358 filed Dec. 16, 2011 the entire content and disclosure of which is incorporated herein by reference.

BACKGROUND

The present disclosure relates to semiconductor structures, and particularly to semiconductor structures including a fin structure having a stack of a rare-earth oxide fin portion and a semiconductor fin portion, and methods of manufacturing the same.

FinFETs formed on a semiconductor-on-insulator (SOI) substrate provide inherent electrical isolation among devices. However, the cost of manufacturing SOI substrates is significantly higher than the cost of manufacturing bulk substrates. While finFETs can also be formed on a bulk substrate, electrical isolation among adjacent finFETs on a bulk substrate is in general poor, and provides a leakage path among adjacent devices, thereby degrading the performance of these devices.

SUMMARY

A dielectric template layer is deposited on a substrate. Line trenches are formed within the dielectric template layer by an anisotropic etch that employs a patterned mask layer. The patterned mask layer can be a patterned photoresist layer, or a patterned hard mask layer that is formed by other image transfer methods. A lower portion of each line trench is filled with an epitaxial rare-earth oxide material by a selective rare-earth oxide epitaxy process. An upper portion of each line trench is filled with an epitaxial semiconductor material by a selective semiconductor epitaxy process. The dielectric template layer is recessed to form a dielectric material layer that provides lateral electrical isolation among fin structures, each of which includes a stack of a rare-earth oxide fin portion and a semiconductor fin portion.

According to an aspect of the present disclosure, a semiconductor structure is provided, which includes a fin structure located on a planar top surface of a substrate, wherein the fin structure includes a rare-earth oxide fin portion and a semiconductor fin portion in contact with a top surface of the rare-earth oxide fin portion.

According to another aspect of the present disclosure, a method of forming a semiconductor structure is provided. The method includes: forming a dielectric template layer on a substrate; patterning the dielectric template layer to form at least one trench therein, wherein a top surface of the substrate is physically exposed within each of the at least one trench; forming a rare-earth oxide fin portion at a lower portion of each of the at least one trench by depositing a rare-earth oxide material; and forming a semiconductor fin portion at an upper portion of each of the at least one trench by depositing a semiconductor material.

DETAILED DESCRIPTION

Figure 1A:
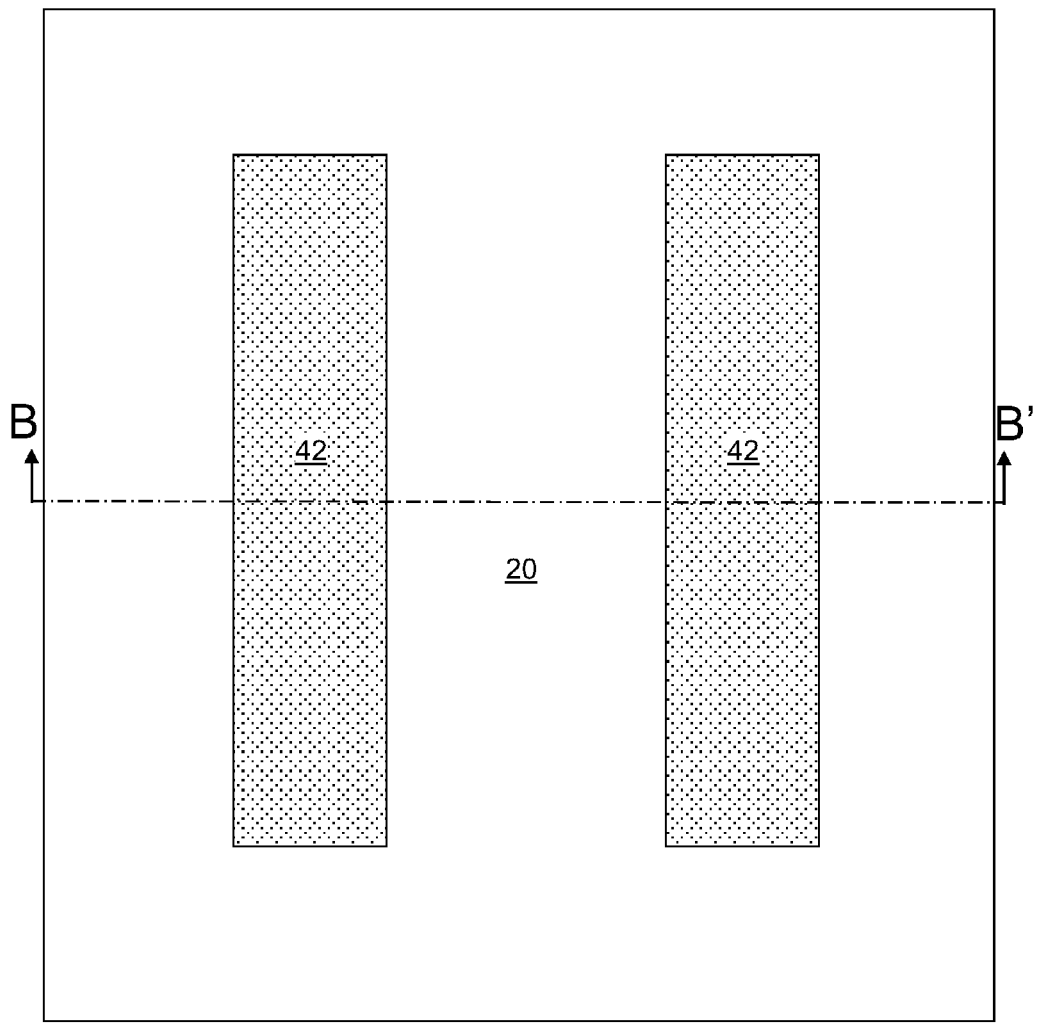
FIG. 1A is a top-down view of a first exemplary semiconductor structure after formation of a dielectric template layer and disposable mandrel structures according to a first embodiment of the present disclosure.

As stated above, the present disclosure relates to semiconductor structures including a fin structure having a stack of a rare-earth oxide fin portion and a semiconductor fin portion, and methods of manufacturing the same, which are now described in detail with accompanying figures. Like and corresponding elements mentioned herein and illustrated in the drawings are referred to by like reference numerals. The drawings are not necessarily drawn to scale.

Figure 1B:
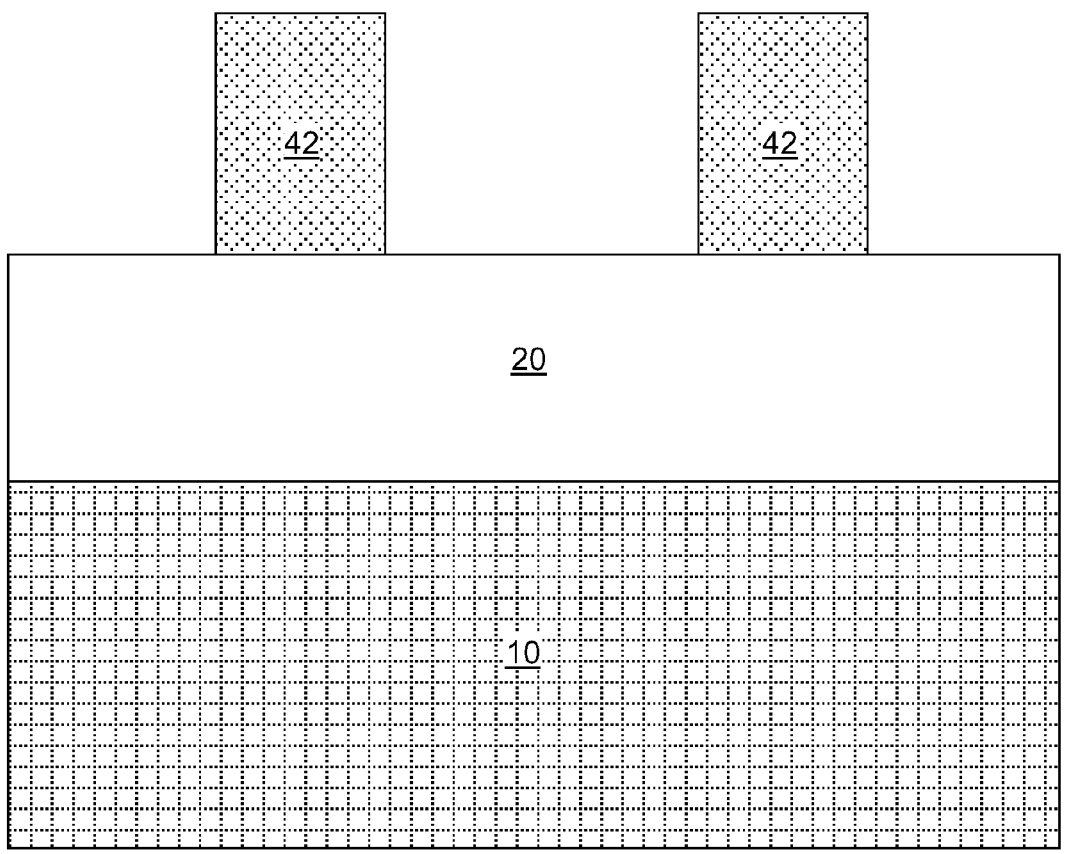
FIG. 1B is a vertical cross-sectional view of the first exemplary semiconductor structure of FIG. 1A along the vertical plane B-B' in FIG. 1A.

Referring to FIGS. 1A and 1B, a first exemplary semiconductor structure according to a first embodiment of the present disclosure includes a substrate 10, which includes a single crystalline material at least at a top surface thereof. The single crystalline material can be any single crystalline material that has the same crystalline structure as a crystalline rare-earth oxide material, i.e., a crystalline oxide of a rare-earth element.

In one embodiment, the single crystalline material can be a single crystalline semiconductor material such as single crystalline silicon, a single crystalline silicon germanium alloy, a single crystalline silicon carbon alloy, a single crystalline silicon germanium carbon alloy, a single crystalline III-V compound semiconductor material, a single crystalline II-VI compound semiconductor material, or an alloy or a combination thereof. In one embodiment, the substrate 10 can include the single crystalline material in an upper portion and a different material in a lower portion. In another embodiment, the substrate 10 can include the single crystalline material throughout the entirety of the substrate 10. In one embodiment, the substrate 10 can be a single crystalline bulk semiconductor substrate including a single crystalline semiconductor material throughout the entirety thereof.

The substrate 8 can have a thickness sufficient to provide mechanical support to layers and/structure to be subsequently formed thereupon. The thickness of the substrate 8 can be from 50 microns to 2 mm, although lesser and greater thicknesses can also be employed.

A dielectric template layer 20 is formed on the top surface of the substrate 10. The dielectric template layer 20 includes a dielectric material such as silicon oxide, silicon nitride, silicon oxynitride, a dielectric metal oxide, or a combination thereof. The dielectric material of the dielectric template layer 20 can be a dielectric material other than a rare-earth oxide material. A planar bottom surface of the dielectric template layer 20 is in contact with a planar top surface of the substrate 10.

In one embodiment the dielectric template layer 20 includes a doped silicon oxide material or undoped silicon oxide material. The dielectric template layer 20 can be formed, for example, by chemical vapor deposition (CVD), atomic layer deposition (ALD), thermal and/or plasma oxidation of an underlying semiconductor material of the substrate 10 (if the substrate 10 includes a semiconductor material), thermal and/or plasma nitridation of an underlying semiconductor material of the substrate (if the substrate 10 includes a semiconductor material), or a combination thereof.

In one embodiment, the dielectric template layer 20 includes silicon oxide deposited by chemical vapor deposition. The thickness of the dielectric template layer 20 can be from 50 nm to 1,000 nm, although lesser and greater thicknesses can also be employed.

A disposable material different from the material of the dielectric template layer 20 is deposited and lithographically patterned to form disposable mandrel structures 42. The disposable material can be, for example, a semiconductor material, a metallic material, or a dielectric material different from the dielectric material of the dielectric template layer. For example, the disposable material can be polysilicon, amorphous silicon, a silicon germanium alloy, a silicon carbon alloy, a III-V semiconductor material, a II-VI semiconductor material, TaN, TiN, WN, an organosilicate glass, or combinations thereof. The disposable material can be deposited as a blanket layer, i.e., a layer having a uniform thickness throughout. The thickness of the deposited disposable material can be from 50 nm to 1,000 nm, although lesser and greater thicknesses can also be employed.

The layer of the deposited disposable material is patterned, for example, by applying a photoresist layer (not shown), lithographically patterning the photoresist layer, and transferring the pattern in the photoresist layer into the layer of the deposited disposable material by an etch, which can be an anisotropic etch such as a reactive ion etch. The remaining portions of the deposited disposable material constitute the disposable mandrel structures 42. The shapes of the disposable mandrel structures 42 can be any closed shape known in the art, including, but not limited to, circles, ellipses, superellipses, regular and irregular polygons, and combinations of linear edges and curved edges that form a closed shape.

In one embodiment, the shapes of the disposable mandrel structures 42 can include at least one trapezoid having a pair of parallel edges. In one embodiment, the shapes of the disposable mandrel structures 42 can include at least one parallelogram having two pairs of parallel edges. In one embodiment, the shapes of the disposable mandrel structures 42 can include at least one rectangle. In one embodiment, the shapes of the disposable mandrel structures 42 can include a plurality of rectangles. In one embodiment, the plurality of rectangles can have a width that is a critical dimension, i.e., a minimum dimension that can be printed by lithographic methods employing a single lithographic exposure and development.

Figure 2A:
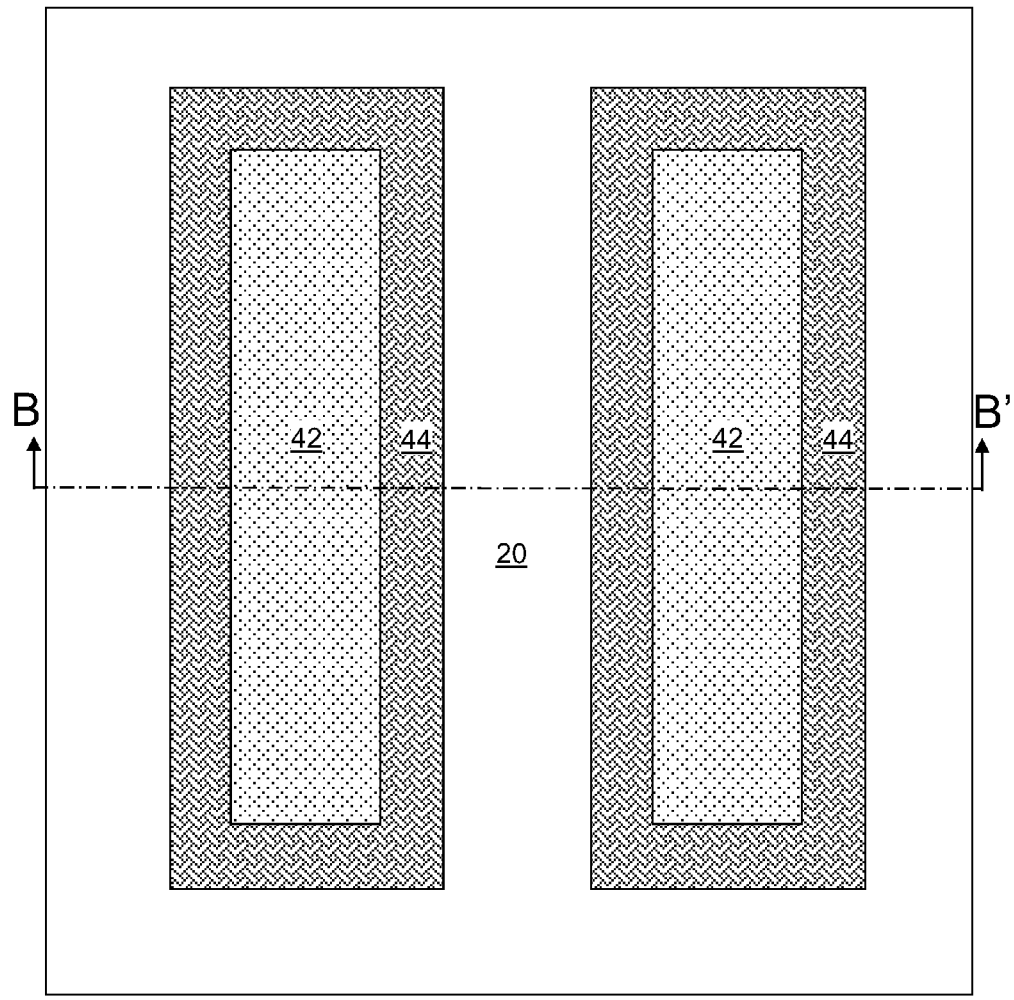
FIG. 2A is a top-down view of the first exemplary semiconductor structure after formation of a spacer structure around the disposable mandrel structures according to the first embodiment of the present disclosure.
Figure 2B:
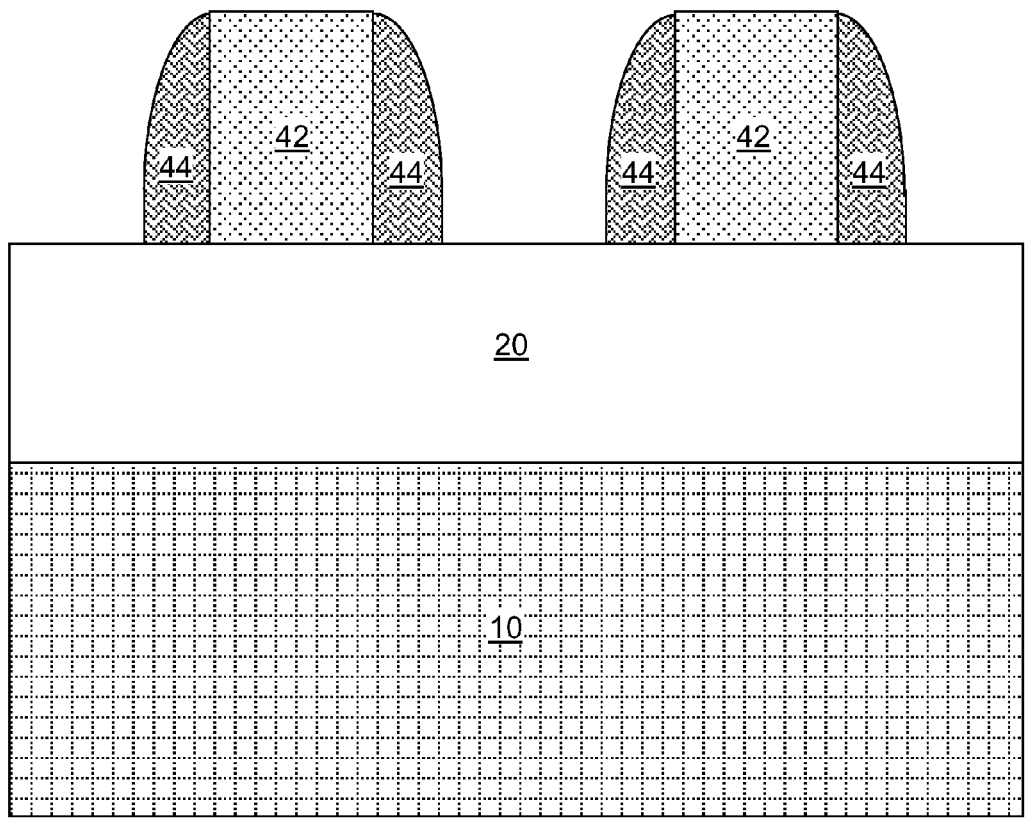
FIG. 2B is a vertical cross-sectional view of the first exemplary semiconductor structure of FIG. 2A along the vertical plane B-B' in FIG. 2A.

Referring to FIGS. 2A and 2B, spacer structures 44 are formed around the peripheries of the disposable mandrel structures 42 by depositing a conformal material layer by a conformal deposition process, such as chemical vapor deposition (CVD), and by removing horizontal portions of the conformal material layer by an anisotropic etch. Remaining vertical portions of the conformal material layer around each disposable mandrel structure 42 constitute a spacer structure 44.

The spacer structure 44 includes a material different from the materials of the dielectric template layer 20 and the disposable mandrel structures 42. In one embodiment, the spacer structure 44 can include a dielectric material different from the material of the dielectric template layer 20. For example, the dielectric template layer 20 can include silicon oxide, and the spacer structure 44 can include silicon nitride. In another embodiment, the spacer structure 44 can include a semiconductor material that is different from the material of the disposable mandrel structures 42. For example, the disposable mandrel structures 42 can include germanium or a silicon germanium alloy, and the spacer structure 44 can include silicon. In another example, the disposable mandrel structures 42 can include a metallic material, or an organosilicate glass, and the spacer structure 44 can include a semiconductor material.

The bottom portion of each spacer structure 44 has a substantially uniform width between a pair of sidewall surfaces, i.e., between the inner sidewall surface and the outer sidewall surface. The width of the spacer structures 44, as measured between an inner sidewall surface of a spacer structure 44 in contact with a vertical sidewall of a disposable mandrel structure 42 and an outer sidewall surface of the spacer structure 44, can be from 5 nm to 200 nm, although lesser and greater widths can also be employed. In one embodiment, the width of the spacer structure 44 can be a sublithographic dimension, i.e., a dimension that is less than a critical dimension, which is the minimum dimension that can be printed by lithographic methods employing a single lithographic exposure.

Figure 3A:
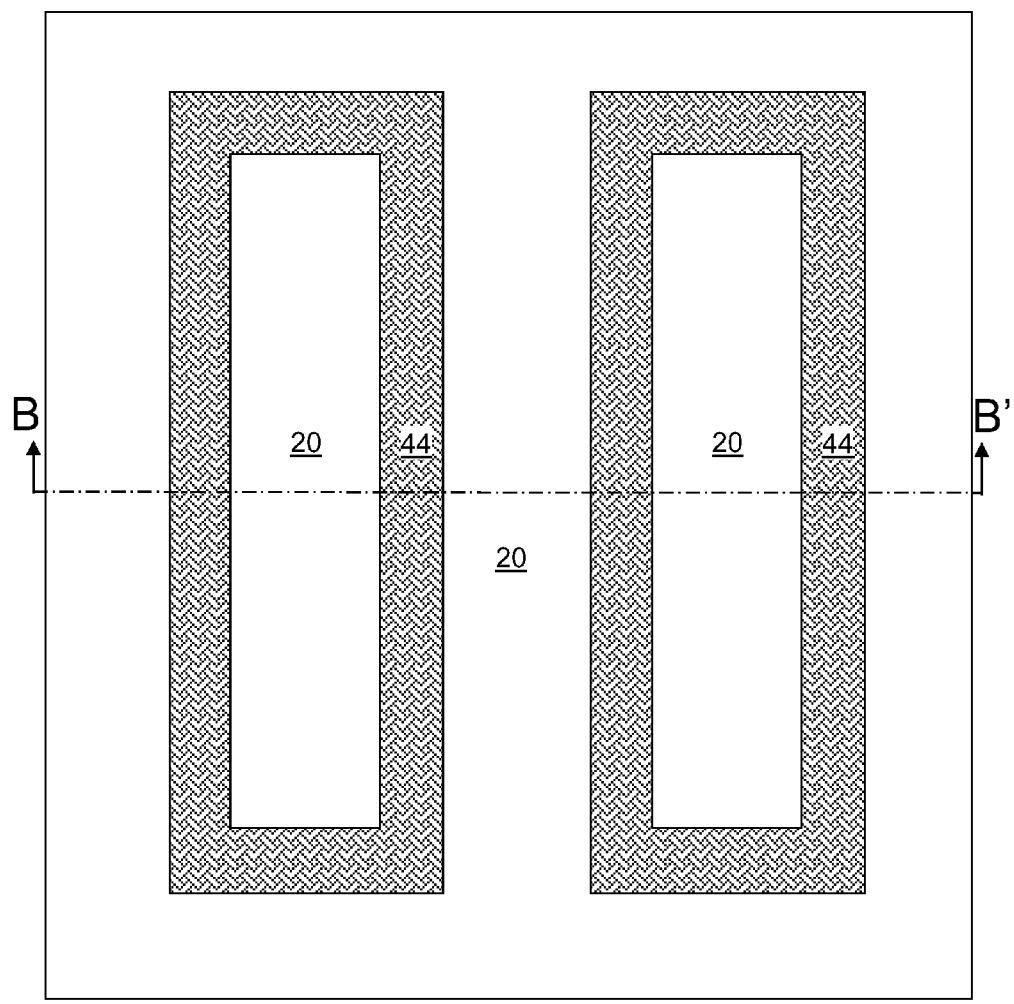
FIG. 3A is a top-down view of the first exemplary semiconductor structure after removal of the disposable mandrel structures according to the first embodiment of the present disclosure.
Figure 3B:
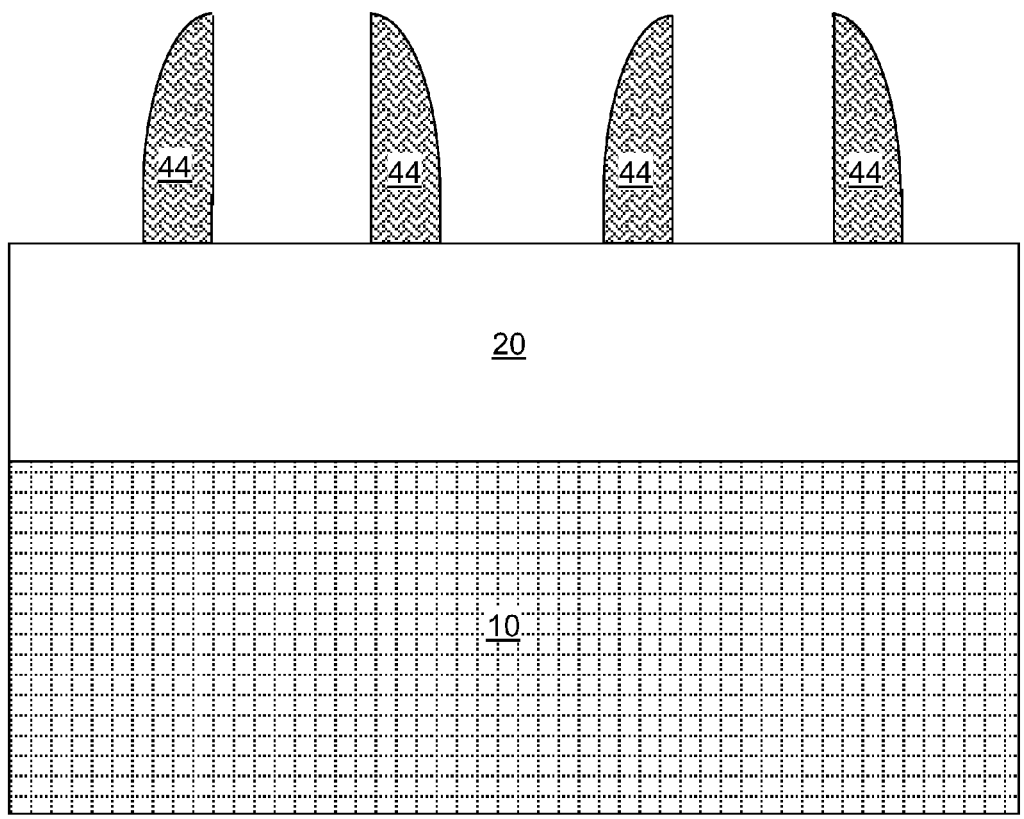
FIG. 3B is a vertical cross-sectional view of the first exemplary semiconductor structure of FIG. 3A along the vertical plane B-B' in FIG. 3A.

Referring to FIGS. 3A and 3B, disposable mandrel structures 42 are removed selective to the spacer structures 44 and the dielectric template layer 20 by an etch, which can be a wet etch or a dry etch. A top surface of the dielectric template layer 20 is physically exposed within each cavity laterally surrounded by a spacer structure 44.

Figure 4A:
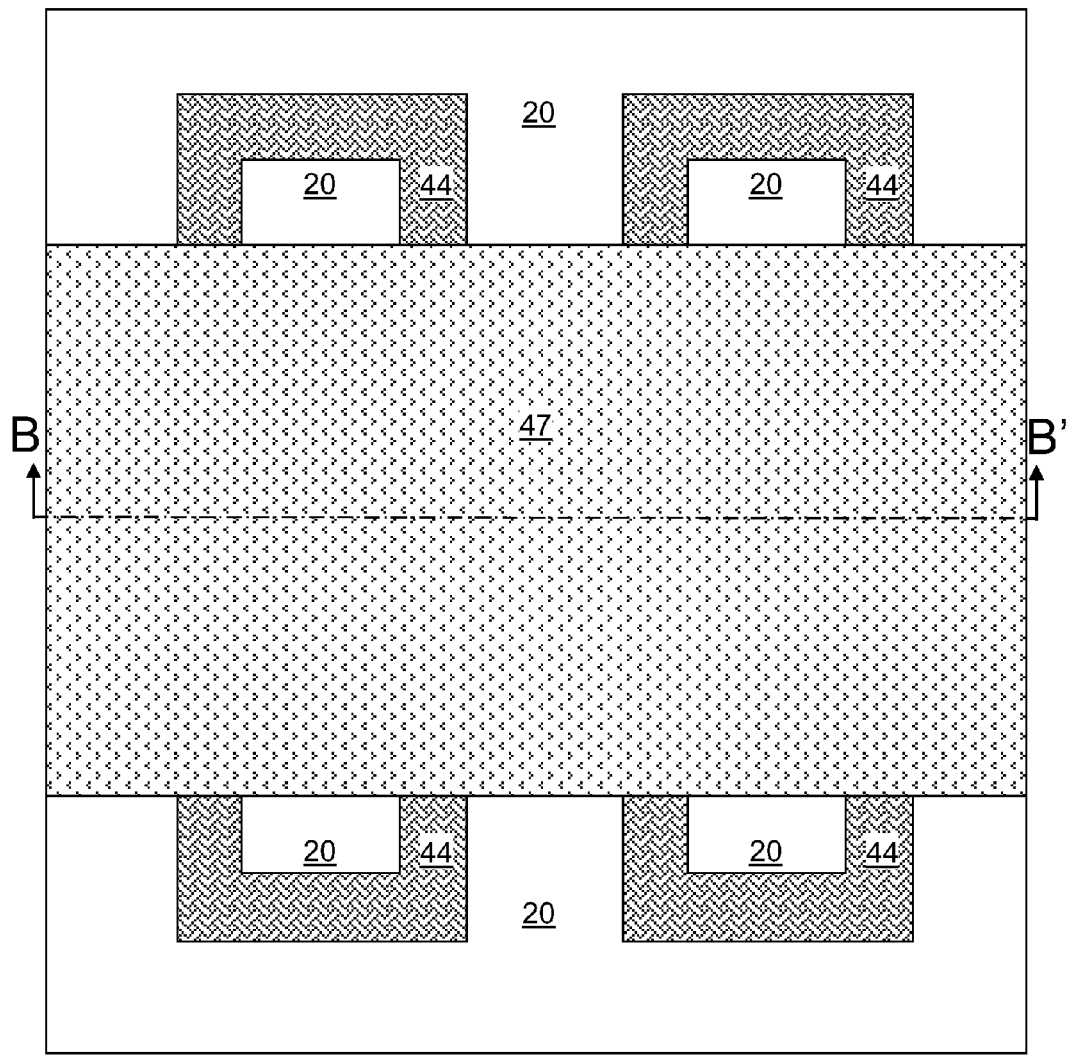
FIG. 4A is a top-down view of the first exemplary semiconductor structure after application and patterning of a photoresist according to the first embodiment of the present disclosure.
Figure 4B:
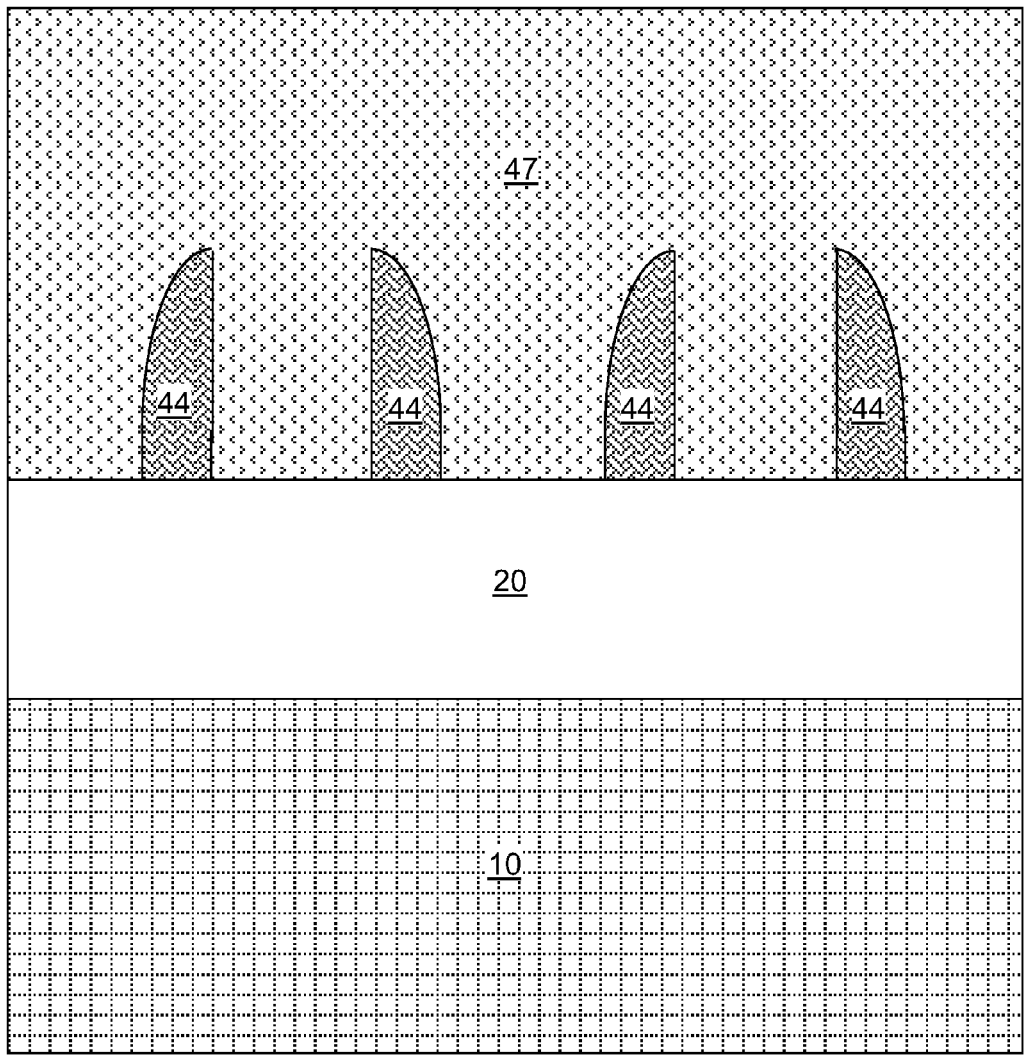
FIG. 4B is a vertical cross-sectional view of the first exemplary semiconductor structure of FIG. 4A along the vertical plane B-B' in FIG. 4A.

Referring to FIGS. 4A and 4B, a photoresist 47 can be optionally applied over the spacer structures 44 and the dielectric template layer 20, and is lithographically patterned to cover portions of the spacer structures 44, while not covering other portions of the spacer structures 44.

In one embodiment, a spacer structure 44 can laterally enclose a rectangular cavity and have a substantially parallel pair of lengthwise portions that extend along a lengthwise direction (e.g., portions of the spacer structure 44 extending in the vertical direction in FIG. 4A) and a substantially parallel pair of widthwise portions that extend along a widthwise direction (e.g., portions of the spacer structure 44 extending in the horizontal direction in FIG. 4A). The photoresist 47 can be patterned such that the pair of widthwise portions are not covered by the photoresist 47, while substantial portions of the pair of lengthwise portions are covered by the photoresist 47.

Figure 5A:
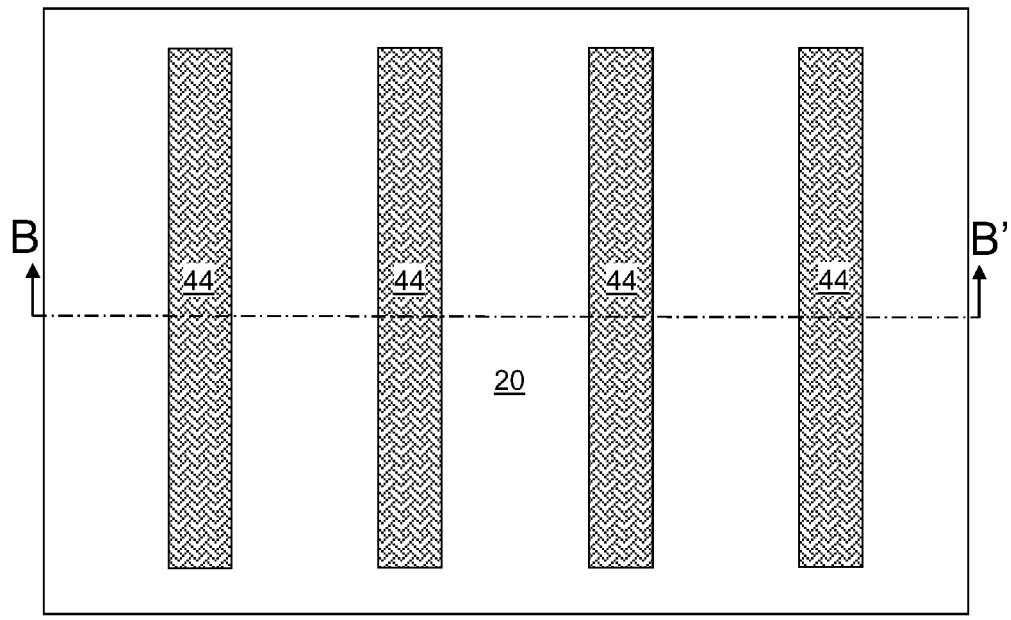
FIG. 5A is a top-down view of the first exemplary semiconductor structure after removal of portions of the spacer structure not covered by the photoresist and removal of the photoresist according to the first embodiment of the present disclosure.
Figure 5B:
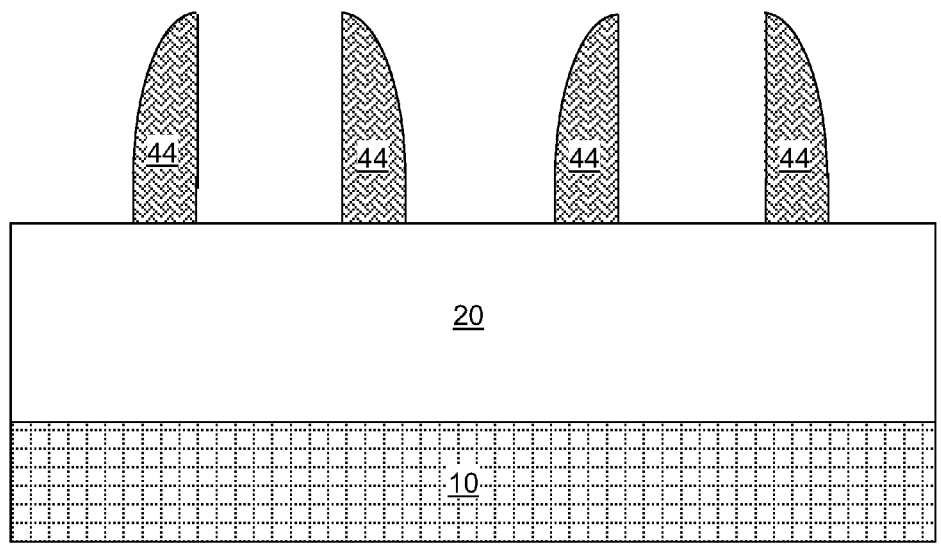
FIG. 5B is a vertical cross-sectional view of the first exemplary semiconductor structure of FIG. 5A along the vertical plane B-B' in FIG. 5A.

Referring to FIGS. 5A and 5B, the physically exposed portions of the spacer structure 44 are removed by an etch, while portions of the spacer structure 44 covered with the photoresist 47 are not removed. The etch can be an isotropic etch or an anisotropic etch. The removal of the spacer structure 44 can be selective to the dielectric material of the dielectric template layer 20, i.e., the etch chemistry can be selected to remove the material of the spacer structure 44, while not removing the material of the dielectric template layer 20.

Figure 6A:
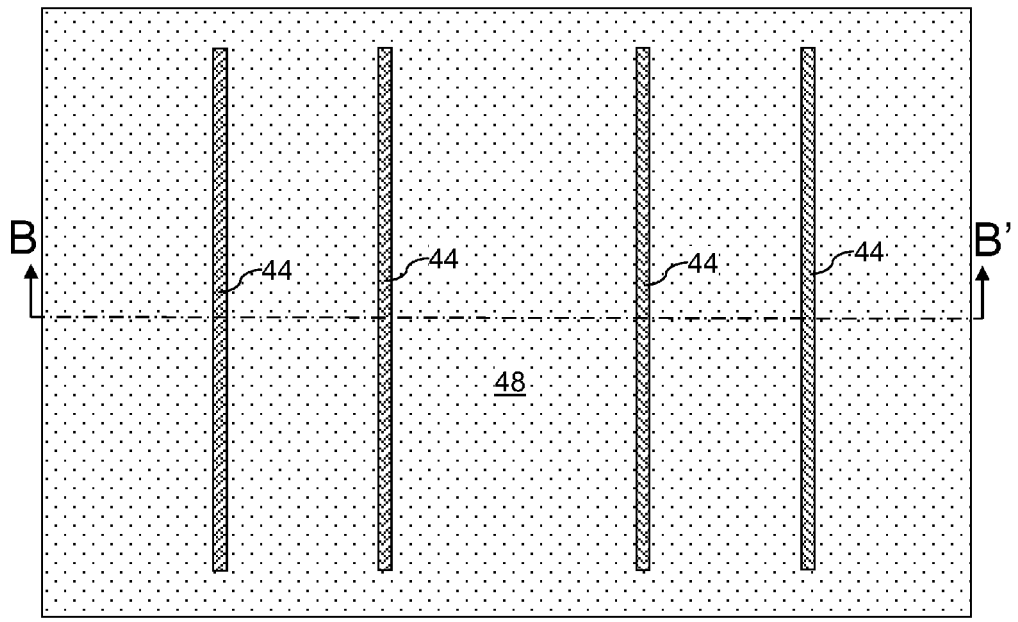
FIG. 6A is a top-down view of the first exemplary semiconductor structure after deposition and planarization of a masking layer according to the first embodiment of the present disclosure.
Figure 6B:
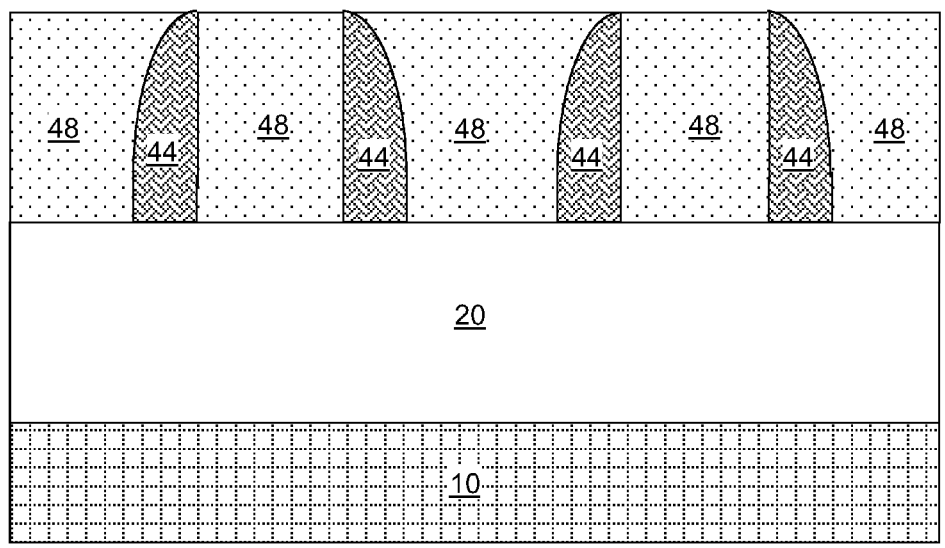
FIG. 6B is a vertical cross-sectional view of the first exemplary semiconductor structure of FIG. 6A along the vertical plane B-B' in FIG. 6A.

Referring to FIGS. 6A and 6B, a masking layer 48 is deposited to fill the space above the dielectric template layer 20 that is not occupied by the spacer structures 44. The spacer structures 44 and the masking layer 48 complimentarily fill the entirety of the space above the dielectric template layer 20. In one embodiment, the complementary dielectric layer 48 can fill the entirety of space below the topmost surface of the spacer structures 44.

The masking layer 48 includes a material different from the material of the spacer structures 44. The material of the masking layer 48 can be the same as, or different from, the material of the dielectric template layer 20. The masking layer 48 is subsequently planarized to form the first exemplary structure illustrated in FIGS. 6A and 6B.

In one embodiment, the spacer structures 44 can include silicon nitride, and the masking layer 48 can include silicon oxide, a metallic material, and/or a semiconductor material. In another embodiment, the spacer structure 44 can include a semiconductor material, and the masking layer 48 can include silicon nitride, silicon oxide, and/or a metallic material. In general, the material of the spacer structures 44 and the material of the masking layer 48 can be selected such that the material of the spacer structures 44 can be removed selective to the material of the masking layer 48.

Figure 7A:
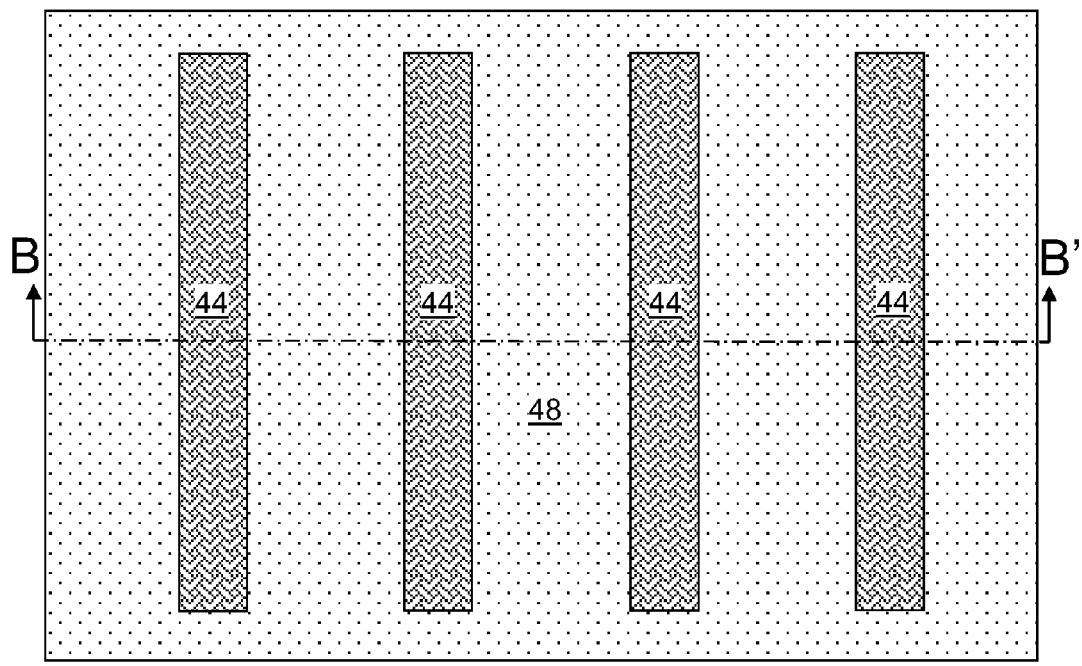
FIG. 7A is a top-down view of the first exemplary semiconductor structure after additional planarization of the masking layer and the spacer structures according to the first embodiment of the present disclosure.
Figure 7B:
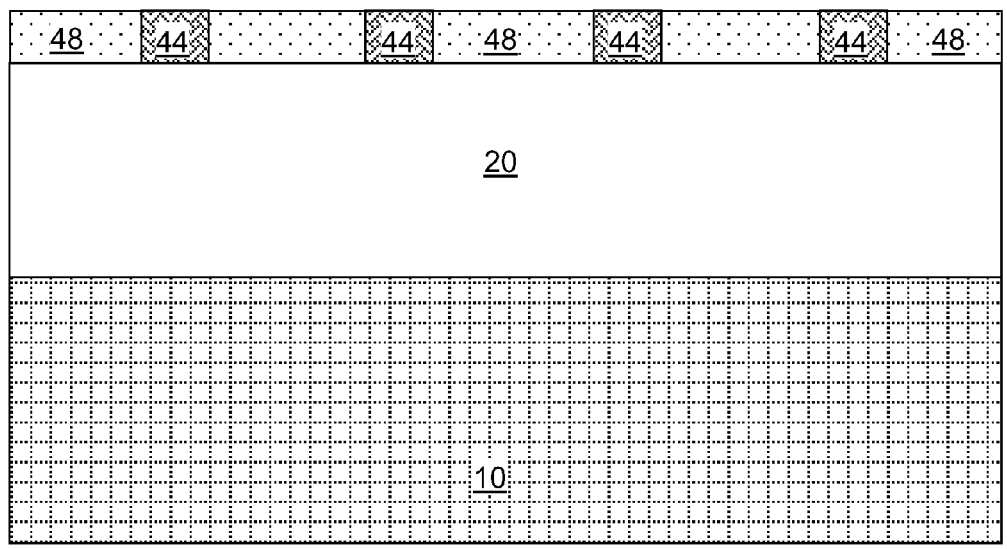
FIG. 7B is a vertical cross-sectional view of the first exemplary semiconductor structure of FIG. 7A along the vertical plane B-B' in FIG. 7A.

Referring to FIGS. 7A and 7B, the spacer structures 44 and the masking layer 48 can be further planarized, for example, by chemical mechanical planarization. For example, the spacer structures 44 and the masking layer 48 can be planarized to a height at which the sidewall surfaces of the spacer structures 44 are vertical.

Figure 8A:
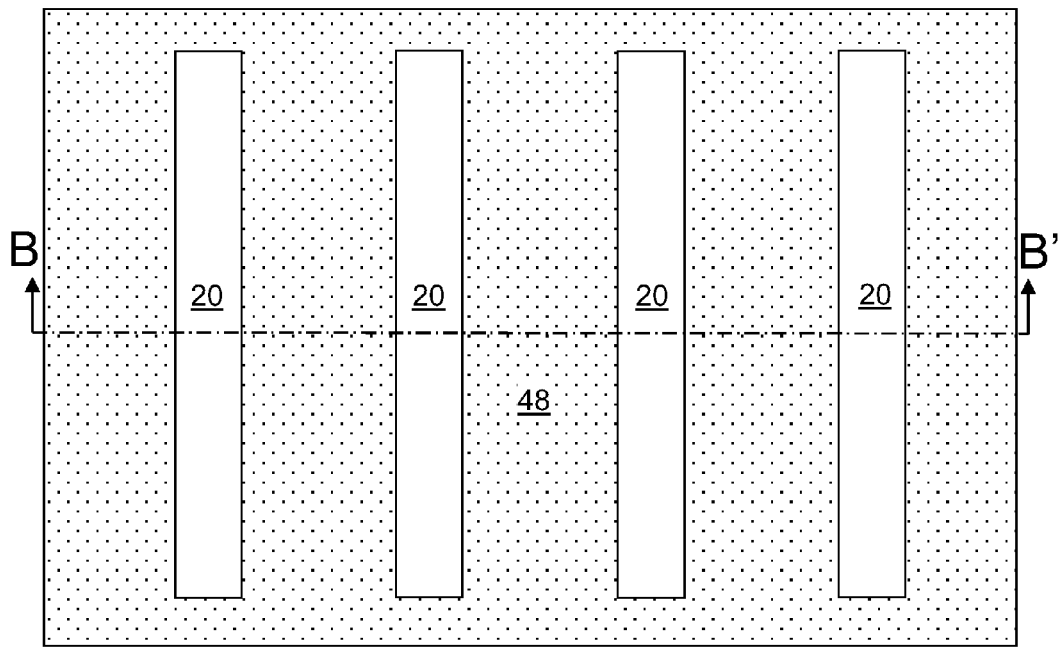
FIG. 8A is a top-down view of the first exemplary semiconductor structure after removal of the spacer structures selective to the masking layer according to the first embodiment of the present disclosure.
Figure 8B:
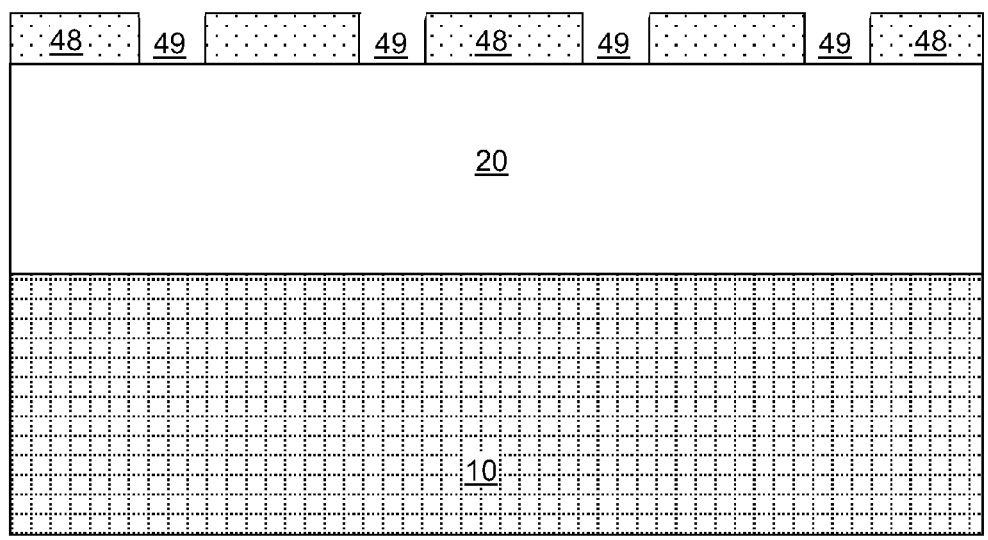
FIG. 8B is a vertical cross-sectional view of the first exemplary semiconductor structure of FIG. 8A along the vertical plane B-B' in FIG. 8A.

Referring to FIGS. 8A and 8B, the remaining portions of the spacer structures 44 are removed selective to the masking layer 48. A line trench 49 having a pair of substantially parallel vertical sidewalls is formed within each cavity from which the remaining portions of the spacer structures 44 are removed. Each line trench 49 has a substantially uniform width between a pair of vertical sidewall surfaces of the masking layer 48. The top surface of the dielectric template layer 20 is physically exposed at the bottom of each line trench 49.

Figure 9A:
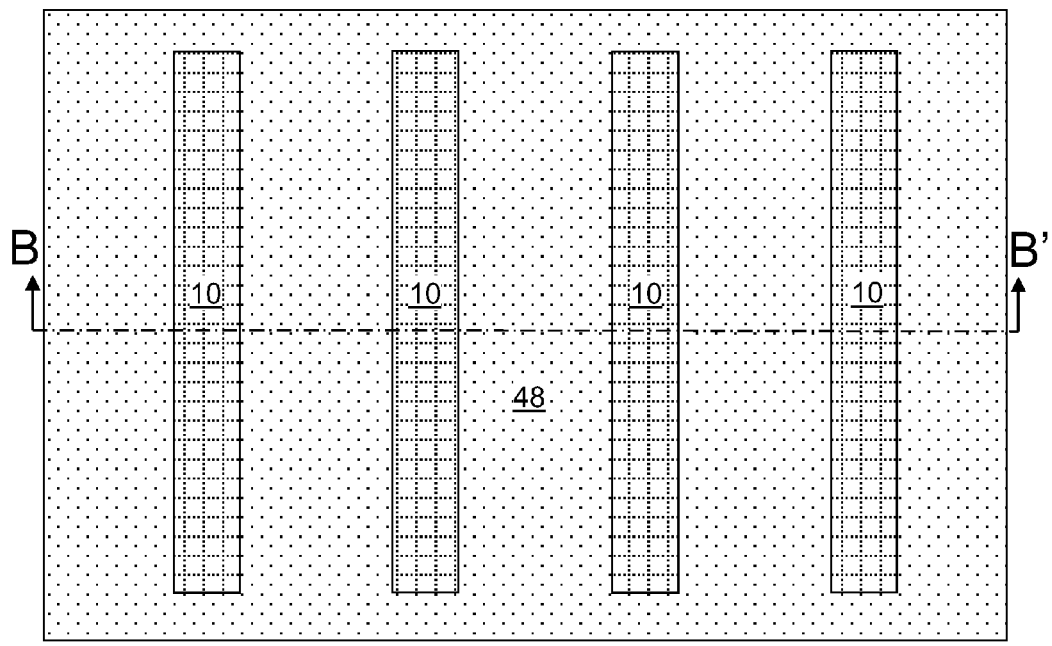
FIG. 9A is a top-down view of the first exemplary semiconductor structure after transfer of a pattern in the masking layer into the dielectric template layer to form line trenches therein according to the first embodiment of the present disclosure.
Figure 9B:
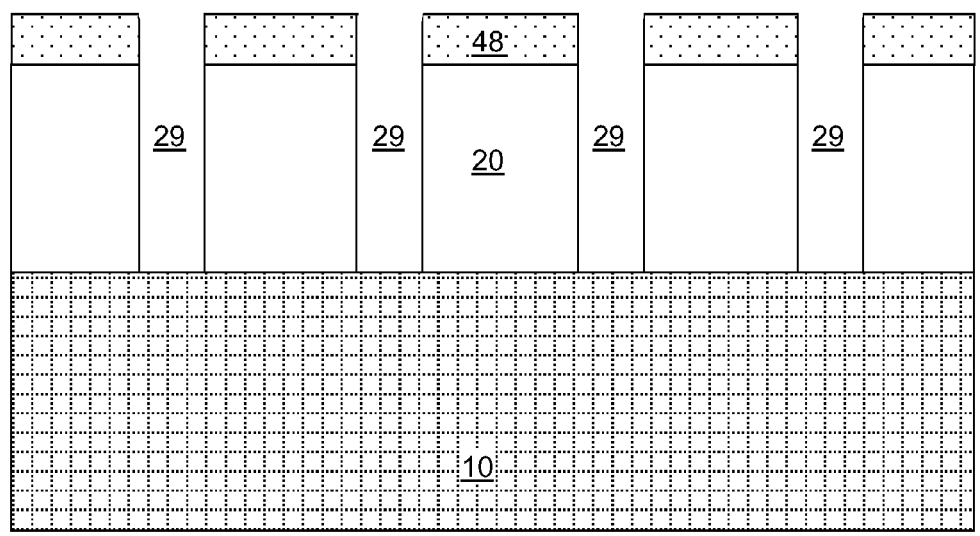
FIG. 9B is a vertical cross-sectional view of the first exemplary semiconductor structure of FIG. 9A along the vertical plane B-B' in FIG. 9A.

Referring to FIGS. 9A and 9B, the pattern in the masking layer 48 is transferred into the dielectric template layer 20 by an anisotropic etch such as a reactive ion etch. The anisotropic etch removes the dielectric material of the dielectric template layer 20 employing the masking layer 48 as a mask layer, i.e., a layer that is employed as an etch mask. A line trench 29 having a substantially uniform width between a pair of vertical sidewall surface of the dielectric template layer 20 is formed underneath each line trench (See FIGS. 8A and 8B) within the masking layer 48. The sidewalls of the line trenches 29 can be vertically coincident with sidewalls of the line trenches within the masking layer 48. In one embodiment, the width of the line trenches 29 can be a sublithographic dimension. Some or all of the masking layer 48 may be removed during the anisotropic etch that forms the line trenches 29.

Figure 10A:
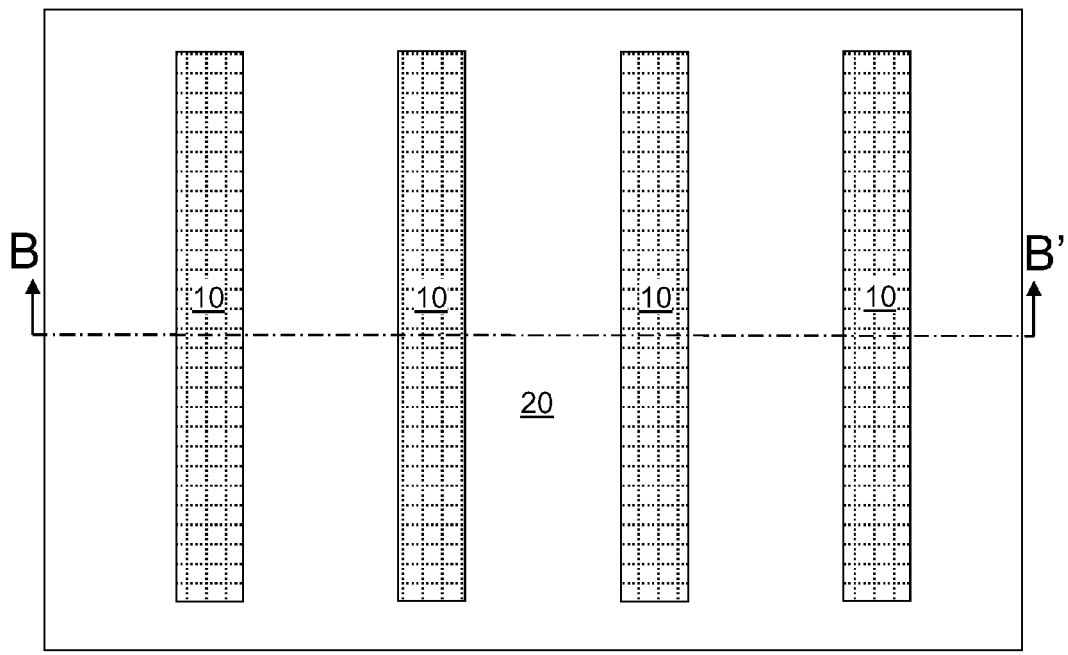
FIG. 10A is a top-down view of the first exemplary semiconductor structure after optional removal of the masking layer according to the first embodiment of the present disclosure.
Figure 10B:
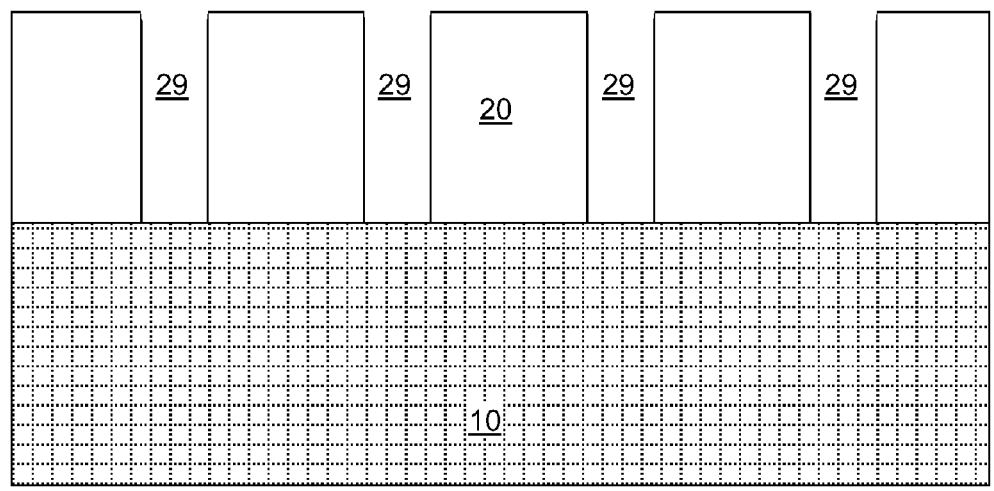
FIG. 10B is a vertical cross-sectional view of the first exemplary semiconductor structure of FIG. 10A along the vertical plane B-B' in FIG. 10A.

Referring to FIGS. 10A and 10B, any remaining portion of the masking layer 48 can be optionally removed.

In general, at least one trench is formed within the dielectric template layer 20. The at least one trench may, or may not, have a pair of vertical sidewalls of the patterned dielectric template layer 20, and may, or may not, have a uniform spacing between the pair of vertical sidewalls if the pair of vertical sidewalls is present. The top surface of the substrate 10 is physically exposed within each of the at least one trench within the dielectric template layer 20.

Figure 11A:
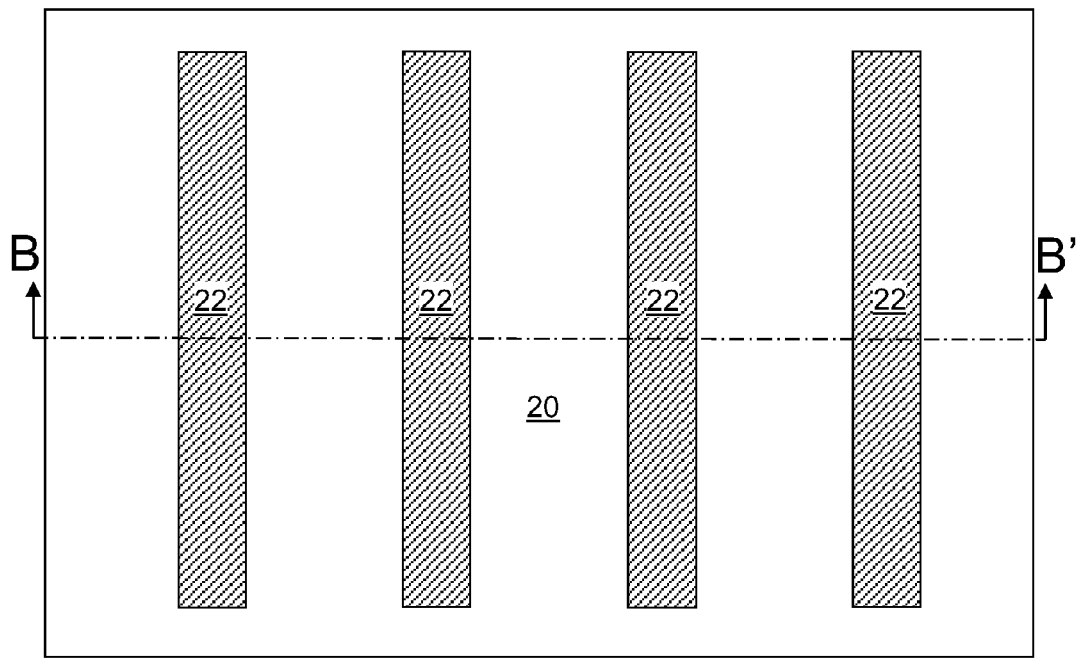
FIG. 11A is a top-down view of the first exemplary semiconductor structure after selective deposition of rare-earth oxide fin portions according to the first embodiment of the present disclosure.
Figure 11B:
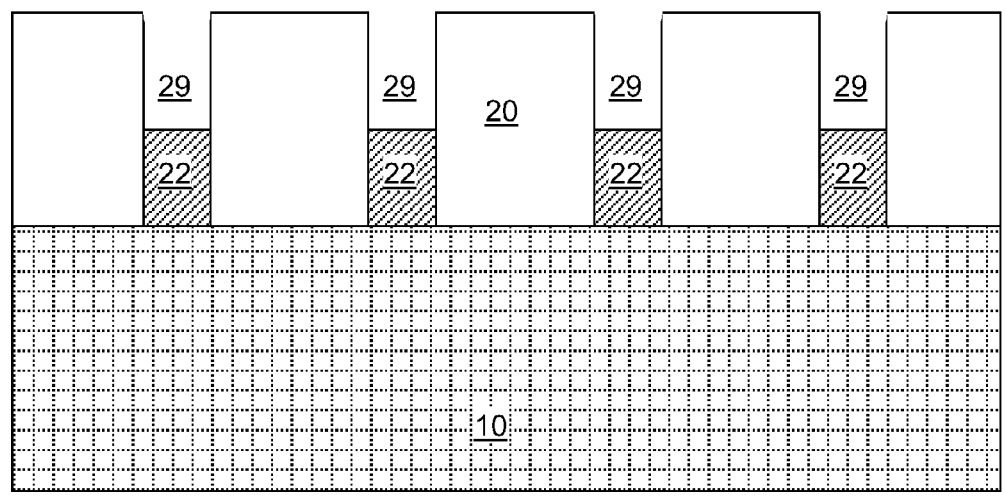
FIG. 11B is a vertical cross-sectional view of the first exemplary semiconductor structure of FIG. 11A along the vertical plane B-B' in FIG. 11A.

Referring to FIGS. 11A and 11B, a rare-earth oxide fin portion 22 is formed in a lower portion of each of the at least one trench, e.g., the line trenches 29, by depositing a rare-earth oxide material. In one embodiment, the deposited rare-earth oxide material is a single crystalline rare-earth oxide material that is epitaxially aligned to a single crystalline material in the substrate 10.

A rare-earth oxide material is an oxide material of a rare-earth element. Rare earth elements are also referred to as Lanthanides, and include La, Ce, Pr, Nd, Pm, Sm, Eu, Gd, Tb, Dy, Ho, Er, Tm, Yb, and Lu. The ionic radii of rare earth elements decrease gradually with the atomic number, and the total variation of the ionic radii of rare earth elements is less than 15% among one another. The rare earth elements form various single crystalline dielectric oxides with a valance of +3, i.e., a dielectric oxide having a chemical formula of $M_2O_3$, in which M can be any of the rare earth elements.

Crystalline rare earth oxides are lattice coincident on a class of elemental or alloyed single crystalline semiconductor materials including single crystalline silicon, a single crystalline silicon-germanium alloy, a single crystalline silicon-carbon alloy, and a single crystalline silicon-germanium-carbon alloy. For each single crystalline $M_2O_3$ in which M is a rare earth element, at least one single crystalline semiconductor material having a lattice constant that is one half the lattice constant of the single crystalline $M_2O_3$ exists among single crystalline silicon, a single crystalline silicon-germanium alloy, a single crystalline silicon-carbon alloy, and a single crystalline silicon-germanium-carbon alloy.

For example, twice the lattice constant of silicon is between the lattice constant of gadolinium oxide ($Gd_2O_3$) and the lattice constant of neodymium oxide ($Nd_2O_3$). Thus, the composition of a single crystalline alloy of gadolinium oxide and neodymium oxide can be selected to match twice the lattice constant of silicon. In other words, the value x in the compound $Gd_{2-x}Nd_xO_3$ can be selected to provide a single crystalline compound having a lattice constant that is twice the lattice constant of silicon.

In another example, twice the lattice constant of germanium is between the lattice constant of praseodymium oxide ($Pd_2O_3$) and the lattice constant of lanthanum oxide ($La_2O_3$). Thus, the composition of a single crystalline alloy of praseodymium oxide and lanthanum oxide can be selected to match twice the lattice constant of germanium. In other words, the value y in the compound $Pd_{2-y}La_yO_3$ can be selected to provide a single crystalline compound having a lattice constant that is twice the lattice constant of silicon.

In a non-limiting exemplary embodiment, the rare-earth oxide fin portions 22 can include a single crystalline rare earth oxide selected from $Er_2O_3$, $Gd_2O_3$, $Nd_2O_3$, $Pr_2O_3$, $La_2O_3$, and a single crystalline alloy thereof.

In addition, crystalline rare earth oxides are lattice coincident on various single crystalline semiconductor materials that include III-V compound semiconductor materials and II-VI compound semiconductor materials. Thus, for each single crystalline $M_2O_3$ in which M is a rare earth element, at least one single crystalline compound semiconductor material having a lattice constant that is one half the lattice constant of the single crystalline $M_2O_3$ exists.

By selecting a rare-earth oxide material that is an oxide of a single rare-earth element or an oxide of an alloy of at least two rare-earth elements, the rare-earth oxide fin portions 22 can be lattice matched to the underlying single crystalline material, which can be a single crystalline semiconductor material.

Method of forming a single crystalline rare-earth oxide material is described, for example, in U.S. Pat. Nos. 7,655,327 and 7,709,826 to Atanackovic. Selective deposition of a single crystalline rare-earth oxide material can be effected, for example, by modifying the deposition method of U.S. Pat. Nos. 7,655,327 and 7,709,826 to Atanackovic to provide an etchant gas, such as HCl, $NF_3$, $CF_4$, $CHF_3$, or combinations thereof into a process chamber concurrently, or alternately, with reactant gas(es) that is/are precursors for the deposited rare-earth oxide material. During the selective deposition, the single crystalline rare-earth oxide material is deposited, and grows from, only on the single crystalline semiconductor surface of the substrate 10, and does not nucleate, or grow from, the surfaces of the dielectric template layer 20.

In one embodiment, the substrate 10 includes a semiconductor material such as single crystalline silicon, a single crystalline silicon-germanium alloy, a single crystalline silicon-carbon alloy, or a single crystalline slicon-germanium-carbon alloy, and the rare-earth oxide fin portions 22 include a single crystalline rare earth oxide material selected from single crystalline $Er_2O_3$, single crystalline $Gd_2O_3$, single crystalline $Nd_2O_3$, single crystalline $Pr_2O_3$, single crystalline $La_2O_3$, and a single crystalline alloy thereof.

Figure 12A:
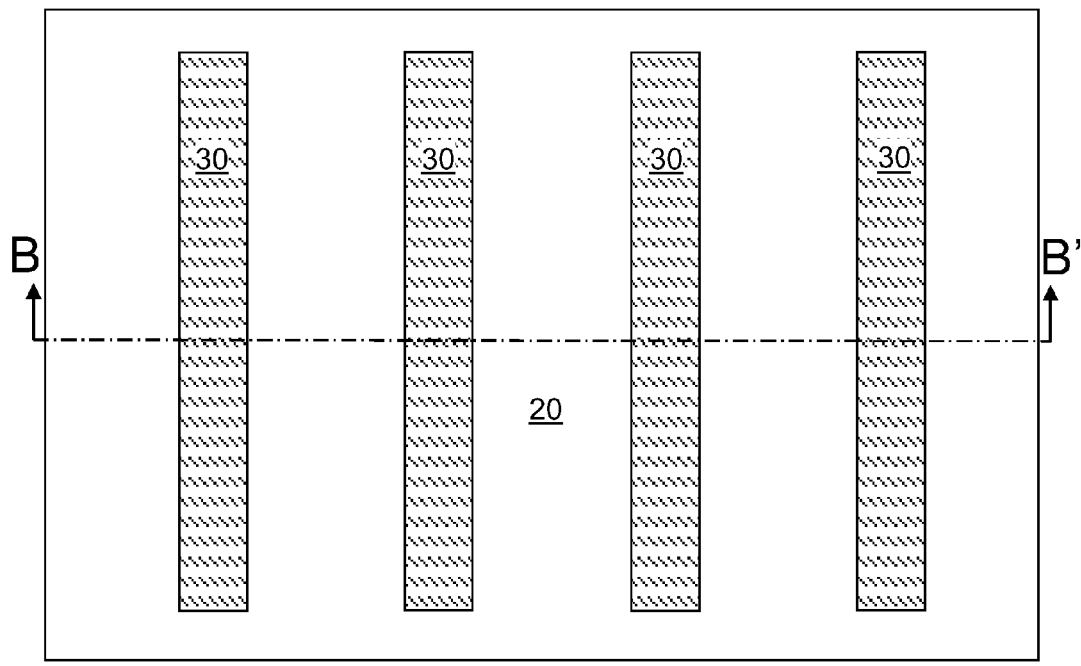
FIG. 12A is a top-down view of the first exemplary semiconductor structure after selective deposition of semiconductor fin portions according to the first embodiment of the present disclosure.
Figure 12B:
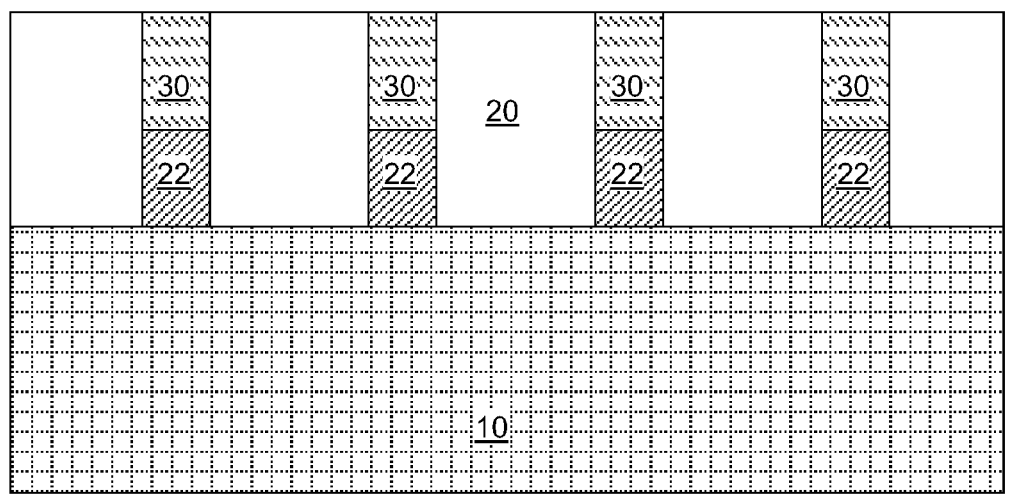
FIG. 12B is a vertical cross-sectional view of the first exemplary semiconductor structure of FIG. 12A along the vertical plane B-B' in FIG. 12A.

Referring to FIGS. 12A and 12B, a semiconductor fin portion 30 is formed at an upper portion of each of the at least one trench, e.g., the line trenches 29 (See FIG. 11B), by depositing a semiconductor material.

In one embodiment, the rare-earth oxide fin portions 22 can include a single crystalline rare-earth oxide material, and the semiconductor fin portions 30 can include a single crystalline semiconductor material that is epitaxially aligned to the single crystalline rare-earth oxide material of the rare-earth oxide fin portions 22.

The height of the top surface of the semiconductor fin portions 30 can be coplanar with, located above, or recessed below, the top surface of the dielectric template layer 20. If the top surfaces of the semiconductor fin portions 30 are raised above the top surface of the dielectric template layer 20, a planarization process can be performed to make the top surfaces of the semiconductor fin portions 30 coplanar with the top surface of the dielectric template layer 20.

Each stack, from bottom to top, of a rare-earth oxide fin portion 22 and an overlying semiconductor fin portion 30 can be a fin structure (22, 30). As used herein, a fin structure is a structure having a pair of lengthwise sidewalls that is longer than the distance between the pair of lengthwise sidewalls, i.e., the width of the fin structure. The semiconductor fin portion 30 is in contact with a top surface of the rare-earth oxide fin portion 22. The fin structure (22, 30) is located on a planar top surface of the substrate 10.

Figure 13A:
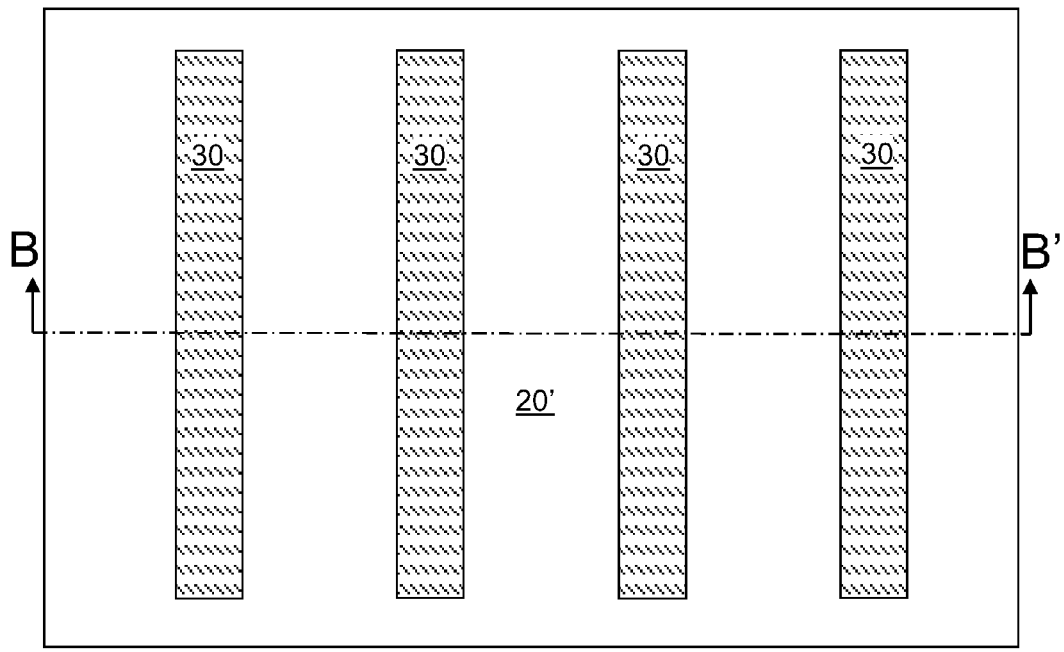
FIG. 13A is a top-down view of the first exemplary semiconductor structure after selective recessing of the dielectric template layer to form a dielectric material layer according to the first embodiment of the present disclosure.
Figure 13B:
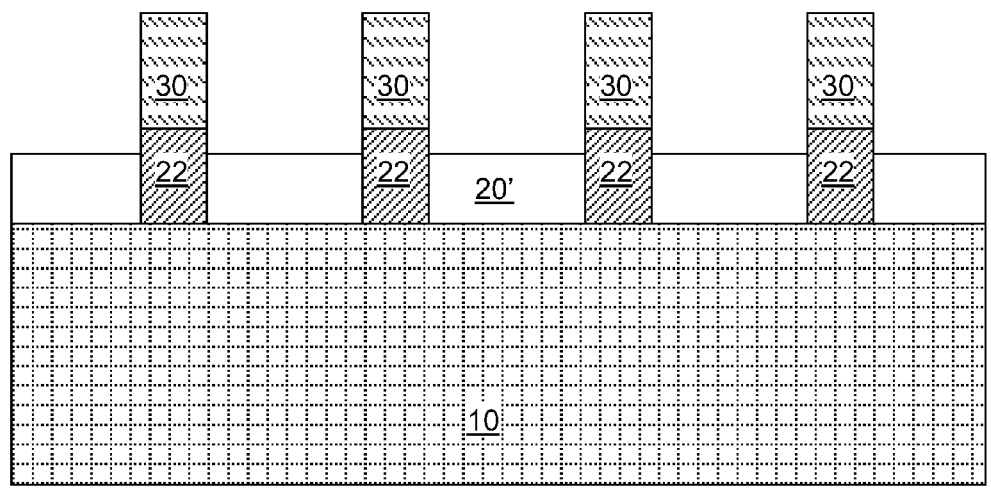
FIG. 13B is a vertical cross-sectional view of the first exemplary semiconductor structure of FIG. 13A along the vertical plane B-B' in FIG. 13A.

Referring to FIGS. 13A and 13B, the dielectric template layer 20 is recessed selective to the fin structures (22, 30), i.e., recessed without etching the fin structure (22, 30). The remaining portion of the dielectric template layer 20 after the recessing constitutes a dielectric material layer 20'. The dielectric material layer 20' has a planar top surface that is recessed relative to a top surface of the semiconductor fin portions 30, and a planar bottom surface that is in contact with the top surface of the substrate 10.

In one embodiment, the top surface of the dielectric material layer 20' can be located below the level of an interface between a rare-earth oxide fin portion 22 and a semiconductor fin portion 30.

Figure 14A:
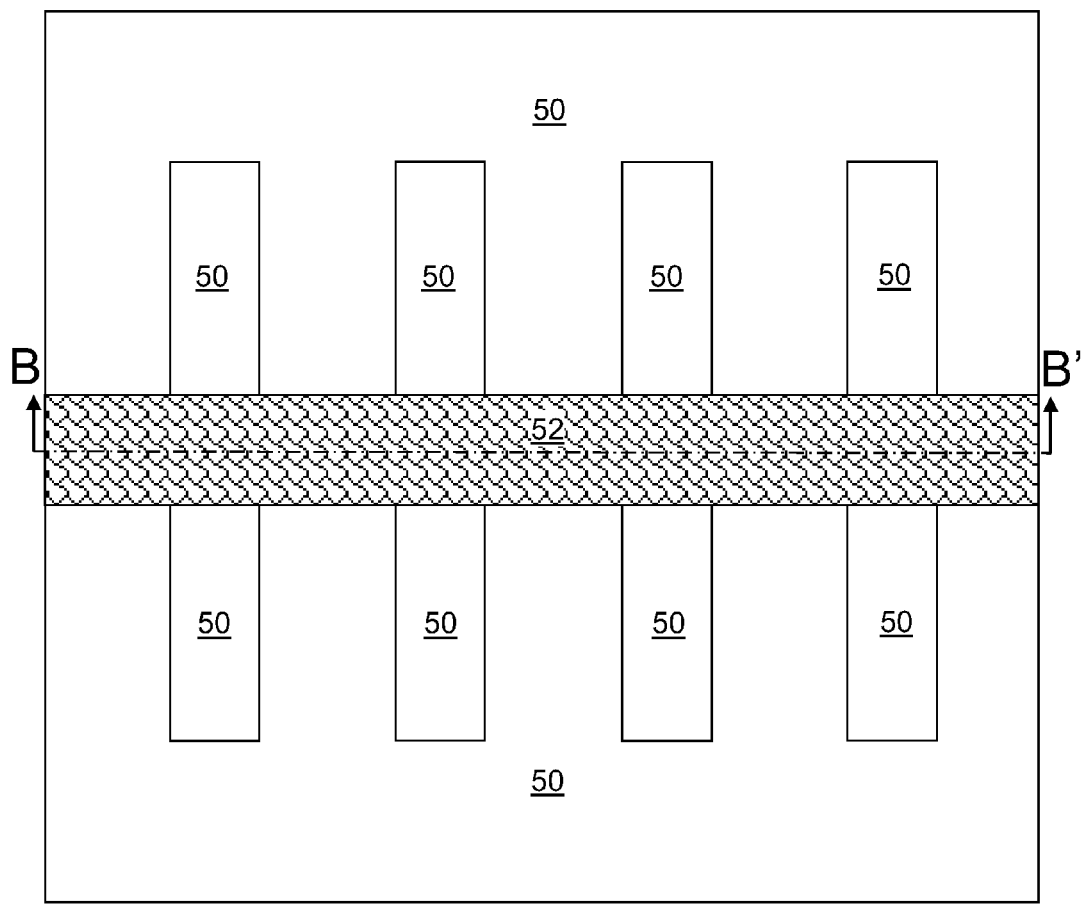
FIG. 14A is a top-down view of the first exemplary semiconductor structure after formation of a gate dielectric layer and a gate electrode according to the first embodiment of the present disclosure.
Figure 14B:
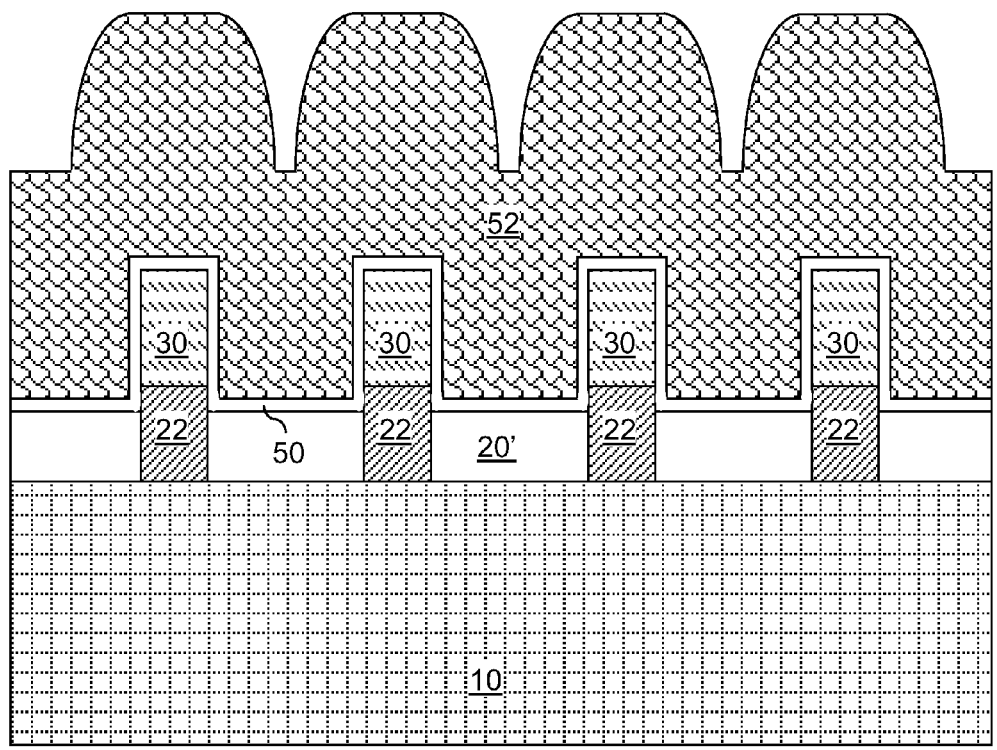
FIG. 14B is a vertical cross-sectional view of the first exemplary semiconductor structure of FIG. 14A along the vertical plane B-B' in FIG. 14A.

Referring to FIGS. 14A and 14B, a gate dielectric layer 50 can be formed, for example, by conformally depositing a dielectric material such as a dielectric metal oxide, silicon oxide, silicon nitride, or a combination thereof. The gate dielectric layer 50 contacts sidewalls of the semiconductor fin portions 30. In one embodiment, the gate dielectric layer 50 can contact all top surfaces and sidewall surfaces of the semiconductor fin portions 30, upper portions of the sidewall surfaces of the rare-earth oxide fin portions 22, and the top surface of the dielectric material layer 20'.

A gate electrode 52 is formed over a middle portion of at least one fin structure (22, 30), for example, by depositing a conductive material layer and patterning the conductive material layer. The gate electrode 52 can overlie one or multiple fin structures (22, 30). In one embodiment, the gate electrode 52 can be spaced from a top surface and sidewall surfaces of each semiconductor fin portion 30 by the gate dielectric layer 50.

Source and drain ion implantation can be performed to convert end portions of each semiconductor fin portion 30 into a source region 34 and a drain region 36. The remaining unimplanted region of each semiconductor fin portion 30 is a body region 35, which underlies the gate electrode 50. The source region 34 is located at one end of a semiconductor fin portion 30. The drain region 36 is located at another end of the semiconductor fin portion 30. Gate spacers (not shown) can be optionally formed prior to, or after, the ion implantation process(es) that form(s) the source and drain regions (34, 36).

Figure 15A:
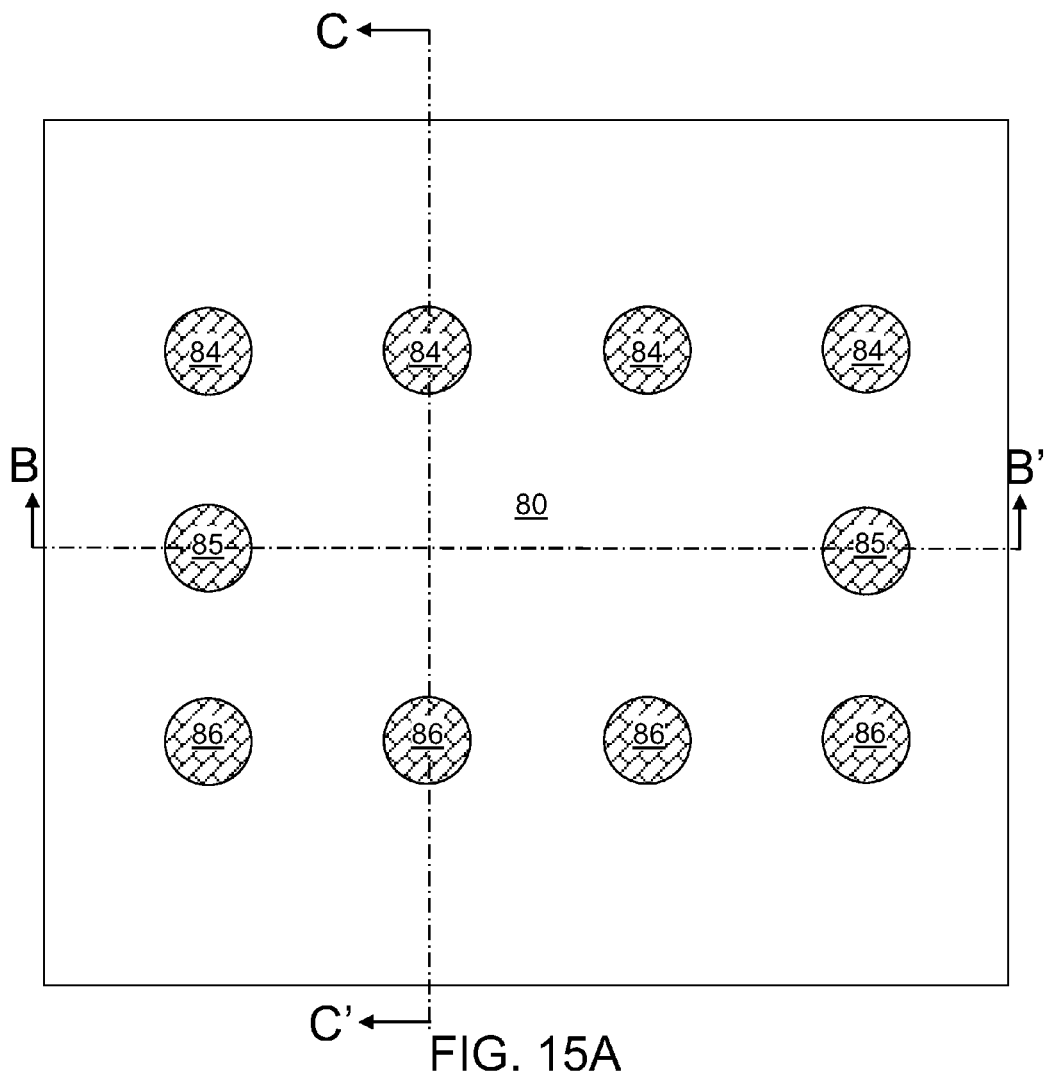
FIG. 15A is a top-down view of the first exemplary semiconductor structure after formation of a middle-of-line (MOL) dielectric layer and contact via structures embedded therein according to the first embodiment of the present disclosure.
Figure 15B:
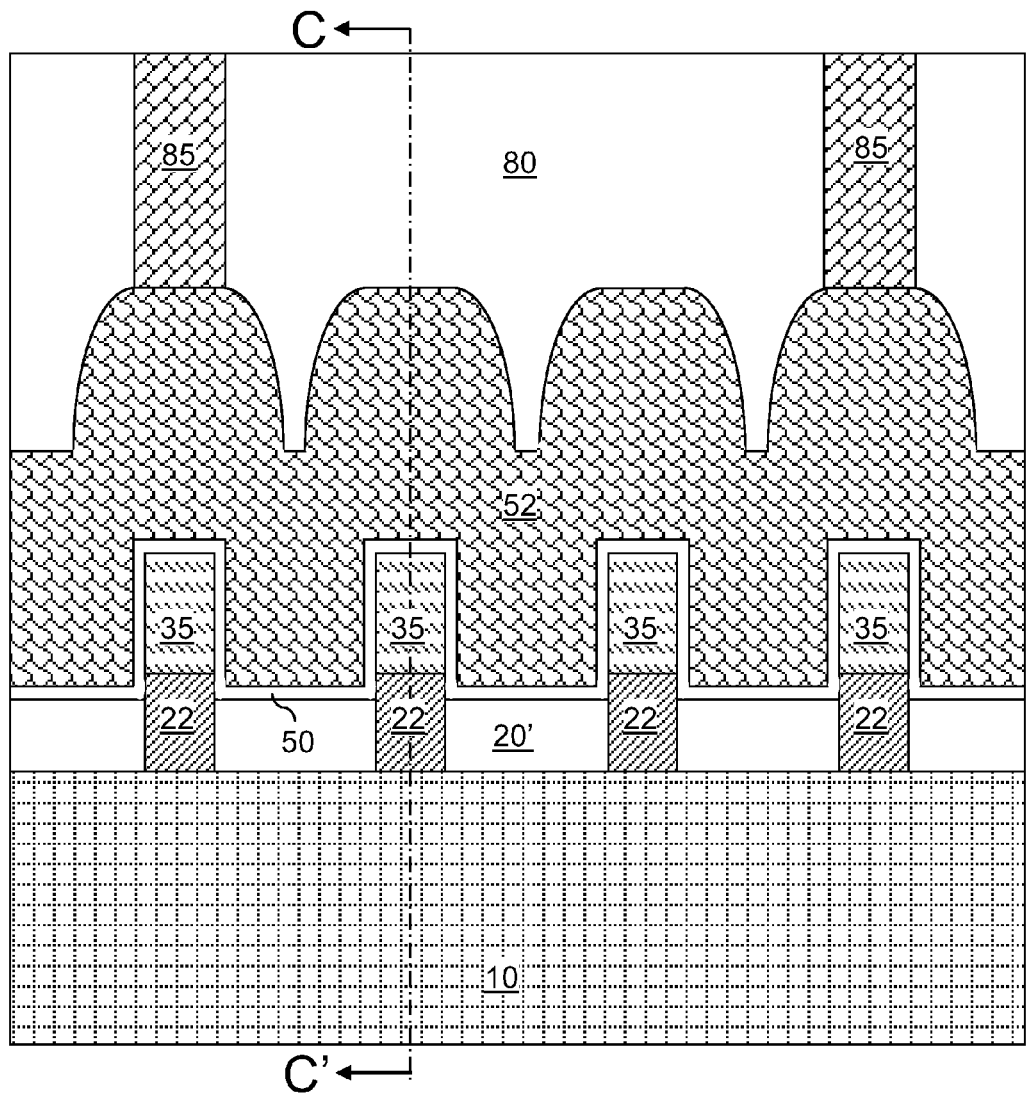
FIG. 15B is a vertical cross-sectional view of the first exemplary semiconductor structure of FIG. 15A along the vertical plane B-B' in FIG. 15A.
Figure 15C:
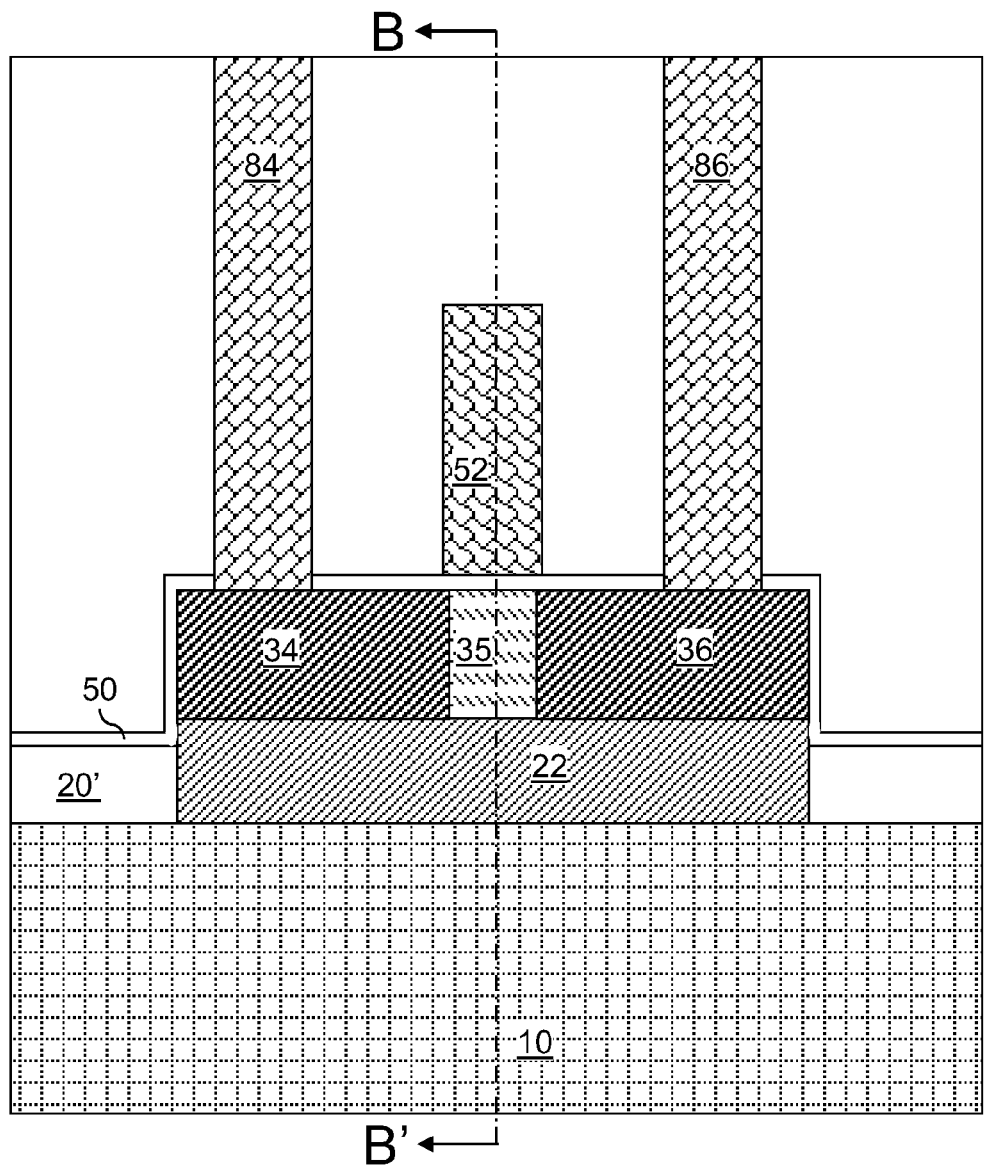
FIG. 15C is a vertical cross-sectional view of the first exemplary semiconductor structure of FIG. 15A along the vertical plane C-C' in FIG. 15A.

Referring to FIGS. 15A, 15B, and 15C, a middle-of-line (MOL) dielectric layer 80 can be deposited over the gate electrode 52 and the gate dielectric layer 50, and subsequently planarized to provide a planar top surface. The MOL dielectric layer 80 includes one or more dielectric materials such as silicon oxide, silicon nitride, a dielectric metal oxide, and a porous or non-porous organosilicate glass (OSG).

Various contact via structures can be formed within the MOL dielectric layer 80, for example, by forming contact via holes and filling the contact via holes with a conductive material. Excess conductive material above the top surface of the MOL dielectric layer 85 can be removed, for example, by chemical mechanical planarization. The various contact via structures can include, for example, source-side contact via structures 84, gate-side contact via structures 85, and drain-side contact via structures 86.

Figure 16A:
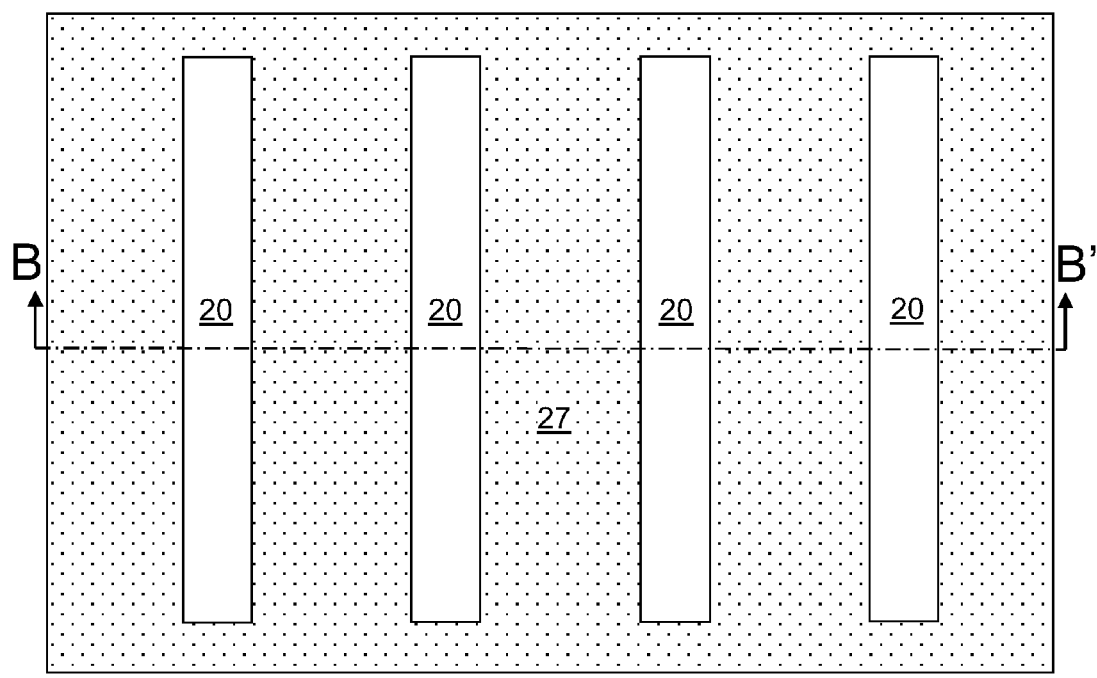
FIG. 16A is a top-down view of a second exemplary semiconductor structure after application and lithographic patterning of a photoresist layer according to a second embodiment of the present disclosure.
Figure 16B:
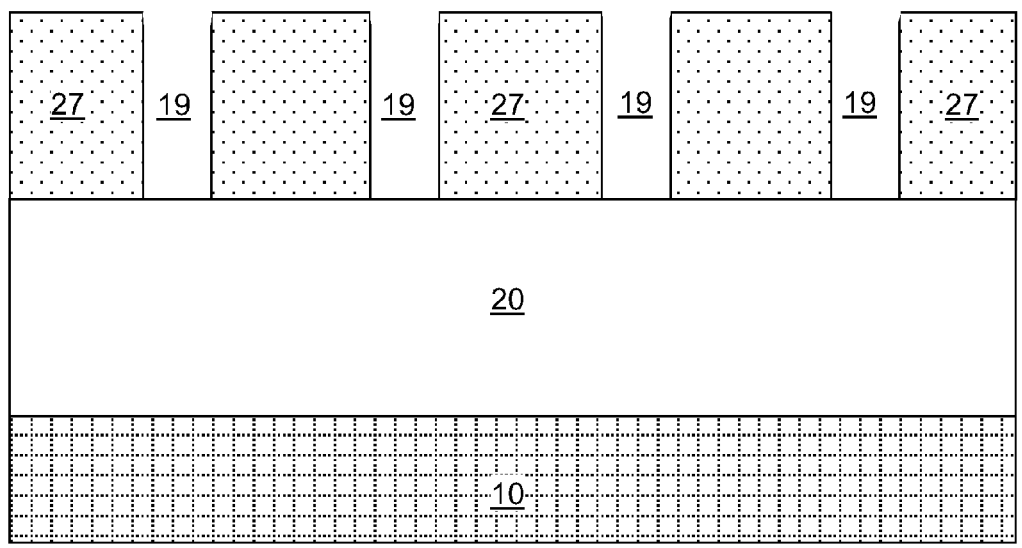
FIG. 16B is a vertical cross-sectional view of the second exemplary semiconductor structure of FIG. 16A along the vertical plane B-B' in FIG. 16A.

Referring to FIGS. 16A and 16B, a second exemplary semiconductor structure according to a second embodiment of the present disclosure can be derived from the first exemplary semiconductor structure of FIGS. 1A and 1B by applying a photoresist layer 27 and lithographically patterning the photoresist layer 27 to include various trenches 19 therein. In one embodiment, at least one of the various trenches 19 can be a line trench having a pair of parallel vertical sidewalls.

The pattern in the photoresist layer 27 can be transferred into the dielectric template layer 20, for example, by an anisotropic etch, to form trenches, which can be line trenches, in the dielectric template layer 20. The top surface of the substrate 20 is physically exposed at a bottom of each trench within the dielectric template layer 20 so that a structure illustrated in FIGS. 10A and 10B can be formed. The widths of the trenches in the dielectric template layer 20 according to the second embodiment are lithographic dimensions, i.e., equal to, or greater than, a critical dimension, i.e., a minimum dimension that can be printed with lithographic methods employing single lithographic exposure.

The processing steps if FIGS. 12A, 12B, 13A, 13B, 14A, 14B, 15A, 15B, and 15C can be subsequently performed in the second embodiment to form a structure illustrated in FIGS. 15A, 15B, and 15C.

While the disclosure has been described in terms of specific embodiments, it is evident in view of the foregoing description that numerous alternatives, modifications and variations will be apparent to those skilled in the art. Various embodiments of the present disclosure can be employed either alone or in combination with any other embodiment, unless expressly stated otherwise or otherwise clearly incompatible among one another. Accordingly, the disclosure is intended to encompass all such alternatives, modifications and variations which fall within the scope and spirit of the disclosure and the following claims.

What is claimed is:

1. A method of forming a semiconductor structure, said method comprising:
   forming a dielectric template layer on a substrate;
   patterning said dielectric template layer to form at least one trench therein, wherein a top surface of said substrate is physically exposed within each of said at least one trench;
   forming a rare-earth oxide fin portion at a lower portion of each of said at least one trench by depositing a rare-earth oxide material;
   forming a semiconductor fin portion at an upper portion of each of said at least one trench by depositing a semiconductor material; and
   recessing said dielectric template layer selective to said semiconductor fin portion and said rare-earth oxide fin portion, wherein a remaining portion of said dielectric template layer constitutes a dielectric material layer having a top surface that is recessed relative to a top surface of said semiconductor fin portion.

2. The method of claim 1, wherein at least one of said at least one trench is a line trench located between a pair of vertical sidewalls of said patterned dielectric template layer and having a uniform spacing between said pair of vertical sidewalls, and a stack of a rare-earth oxide fin portion and a semiconductor fin portion within each of said at least one trench constitutes a fin structure.

3. The method of claim 1, wherein said deposited rare-earth oxide material is a single crystalline rare-earth oxide material that is epitaxially aligned to a single crystalline material in said substrate.

4. The method of claim 3, wherein said deposited semiconductor material is a single crystalline semiconductor material that is epitaxially aligned to said single crystalline rare-earth oxide material.

5. The method of claim 3, wherein said single crystalline material in said substrate is a single crystalline semiconductor material.

6. The method of claim 1, wherein said top surface of said dielectric material layer is located below a level of an interface between said rare-earth oxide fin portion and said semiconductor fin portion.

7. The method of claim 1, further comprising:
   forming a gate dielectric layer directly on sidewalls of said semiconductor fin portion; and
   forming a gate electrode on said gate dielectric layer, wherein said gate electrode is spaced from a top surface and sidewall surfaces of said semiconductor fin portion by said gate dielectric layer.

8. The method of claim 7, further comprising forming at least one contact via structure, wherein said at least one contact via structure is in direct contact with said gate electrode.

9. The method of claim 1, wherein said dielectric template layer comprises silicon oxide.

10. A method of forming a semiconductor structure, said method comprising:
    forming a dielectric template layer on a substrate;
    patterning said dielectric template layer to form at least one trench therein, wherein a top surface of said substrate is physically exposed within each of said at least one trench;
    forming a rare-earth oxide fin portion at a lower portion of each of said at least one trench by depositing a rare-earth oxide material; and
    forming a semiconductor fin portion at an upper portion of each of said at least one trench by depositing a semiconductor material, wherein a horizontal topmost surface of said semiconductor fin portion is coplanar with a topmost horizontal surface of said dielectric template layer.

11. The method of claim 10, wherein at least one of said at least one trench is a line trench located between a pair of vertical sidewalls of said patterned dielectric template layer and having a uniform spacing between said pair of vertical sidewalls, and a stack of a rare-earth oxide fin portion and a semiconductor fin portion within each of said at least one trench constitutes a fin structure.

12. The method of claim 10, wherein said deposited rare-earth oxide material is a single crystalline rare-earth oxide material that is epitaxially aligned to a single crystalline material in said substrate.

13. The method of claim 12, wherein said deposited semiconductor material is a single crystalline semiconductor material that is epitaxially aligned to said single crystalline rare-earth oxide material.

14. The method of claim 12, wherein said single crystalline material in said substrate is a single crystalline semiconductor material.

15. The method of claim 10, further comprising:
    forming a gate dielectric layer directly on sidewalls of said semiconductor fin portion; and
    forming a gate electrode on said gate dielectric layer, wherein said gate electrode is spaced from a top surface and sidewall surfaces of said semiconductor fin portion by said gate dielectric layer.

16. The method of claim 15, further comprising forming at least one contact via structure, wherein said at least one contact via structure is in direct contact with said gate electrode.

17. The method of claim 10, wherein said dielectric template layer comprises silicon oxide.

* * * * *